United States Patent
Toshiyoshi et al.

(10) Patent No.: US 11,451,167 B2
(45) Date of Patent: Sep. 20, 2022

(54) VIBRATION-DRIVEN ENERGY HARVESTING DEVICE AND VIBRATION-DRIVEN ENERGY HARVESTER

(71) Applicants: The University of Tokyo, Tokyo (JP); Saginomiya Seisakusho, Inc., Tokyo (JP)

(72) Inventors: Hiroshi Toshiyoshi, Tokyo (JP); Hisayuki Ashizawa, Sayama (JP); Masahiro Morita, Sayama (JP)

(73) Assignees: The University of Tokyo, Tokyo (JP); Saginomiya Seisakusho, Inc., Tokyo (JP)

( * ) Notice: Subject to any disclaimer, the term of this patent is extended or adjusted under 35 U.S.C. 154(b) by 52 days.

(21) Appl. No.: 17/058,328

(22) PCT Filed: May 27, 2019

(86) PCT No.: PCT/JP2019/020928
§ 371 (c)(1),
(2) Date: Nov. 24, 2020

(87) PCT Pub. No.: WO2019/230658
PCT Pub. Date: Dec. 5, 2019

(65) Prior Publication Data
US 2021/0218349 A1    Jul. 15, 2021

(30) Foreign Application Priority Data
May 31, 2018    (JP) .............................. JP2018-105434

(51) Int. Cl.
*H02N 1/08*    (2006.01)
(52) U.S. Cl.
CPC .................................... *H02N 1/08* (2013.01)

(58) Field of Classification Search
CPC ............ H02N 2/18; H02N 2/186; H02N 1/08; H02N 1/06; B81B 3/00; B81B 3/0018; B81B 3/0021
(Continued)

(56) References Cited

U.S. PATENT DOCUMENTS

2006/0227553 A1* 10/2006 Nakamura ......... G02B 26/0841
362/286
2015/0070941 A1    3/2015 Suzuki et al.
(Continued)

FOREIGN PATENT DOCUMENTS

JP    2008-109772 A    5/2008
JP    2010-11547 A    1/2010
(Continued)

OTHER PUBLICATIONS

Japanese-language Office Action issued in Japanese Application No. 2018-105434 dated Jun. 28, 2021 with English translation (eight (8) pages).
(Continued)

*Primary Examiner* — Ahmed Elnakib
(74) *Attorney, Agent, or Firm* — Crowell & Moring LLP

(57) ABSTRACT

A vibration-driven energy harvesting device includes: a first vibration-driven energy harvesting assembly constituted with a first fixed comb tooth portion and a first movable comb tooth portion that are interdigitated with each other; a second vibration-driven energy harvesting assembly constituted with a second fixed comb tooth portion and a second movable comb tooth portion that are interdigitated with each other; a first output electrode connected to the first vibration-driven energy harvesting assembly; and a second output electrode connected to the second vibration-driven energy harvesting assembly, wherein: an output of the first vibration-driven energy harvesting assembly is different from an
(Continued)

output of the second vibration-driven energy harvesting assembly.

20 Claims, 13 Drawing Sheets

(58) Field of Classification Search
USPC .......................................................... 310/309
See application file for complete search history.

(56) References Cited

U.S. PATENT DOCUMENTS

| | | |
|---|---|---|
| 2016/0204716 A1 | 7/2016 | Suzuki et al. |
| 2018/0041140 A1 | 2/2018 | Fujita et al. |
| 2019/0058420 A1* | 2/2019 | Toshiyoshi ............... H02N 1/08 |

FOREIGN PATENT DOCUMENTS

| | | |
|---|---|---|
| JP | 2014-50249 A | 3/2014 |
| JP | 2016-127656 A | 7/2016 |
| JP | 2016-149914 A | 8/2016 |
| JP | 5990352 B1 | 9/2016 |
| JP | 6002497 B2 | 10/2016 |
| JP | 2017-70163 A | 4/2017 |
| WO | WO 2015/019919 A1 | 2/2015 |
| WO | WO 2017057317 * | 4/2017 |

OTHER PUBLICATIONS

International Search Report (PCT/ISA/210) issued in PCT Application No. PCT/JP2019/020928 dated Aug. 27, 2019 with English translation (three (3) pages).
Japanese-language Written Opinion (PCT/ISA/237) issued in PCT Application No. PCT/JP2019/020928 dated Aug. 27, 2019 (four (4) pages).

* cited by examiner

FIG. 4
(a) 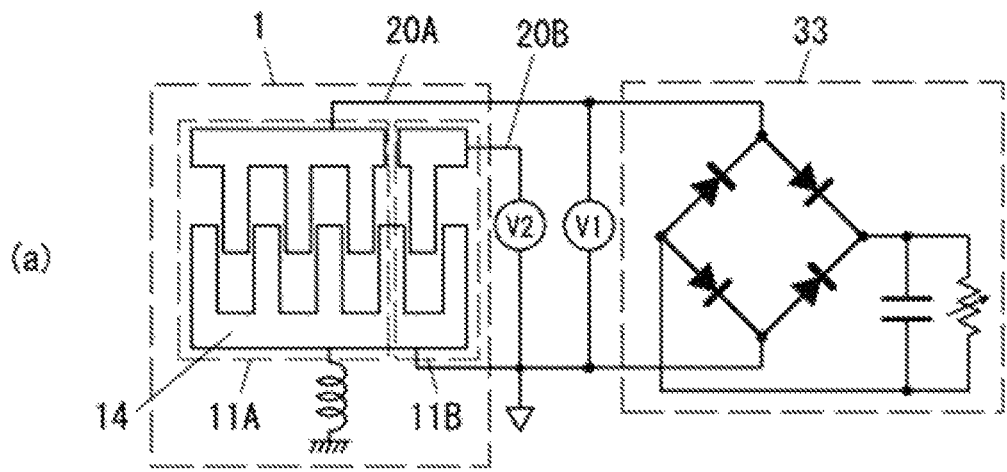
(b) 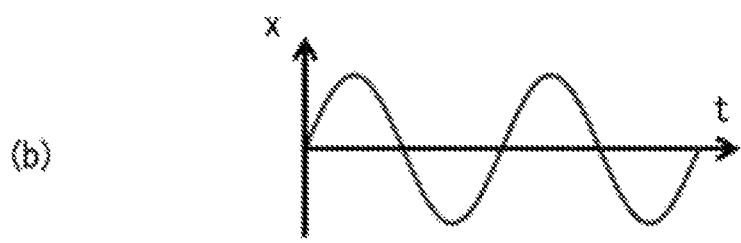
(c) 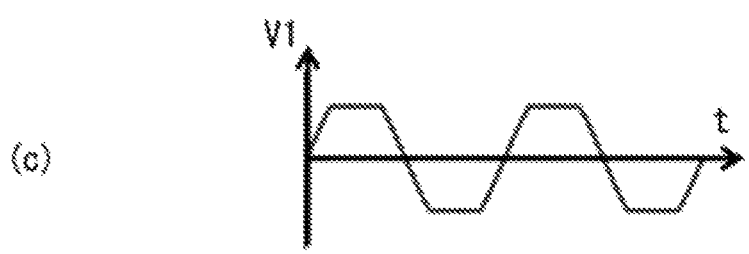
(d) 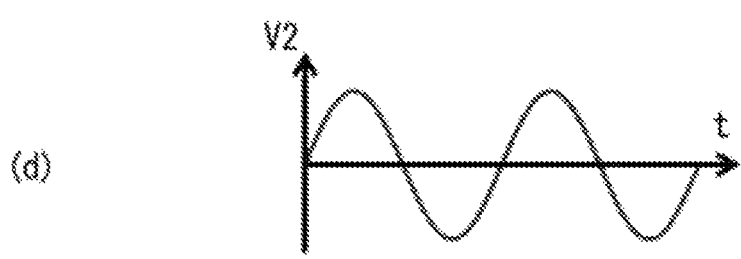

FIG. 6
(a) 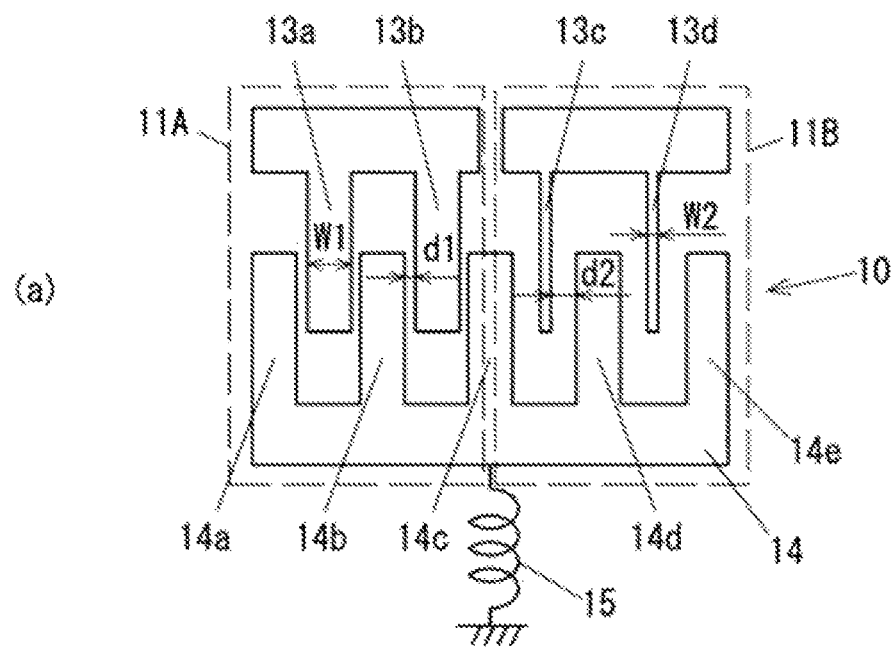
(b) 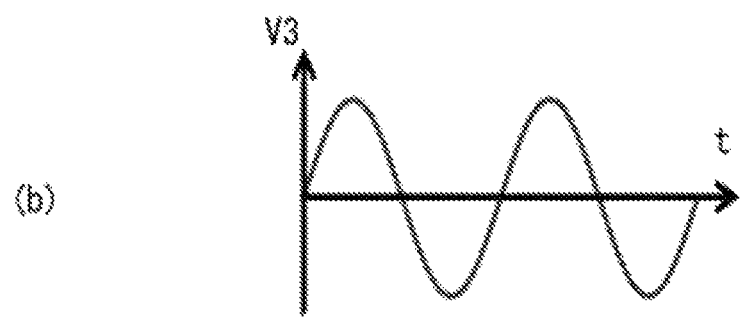
(c) 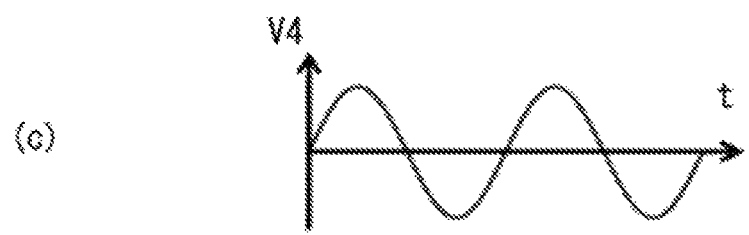

FIG. 8
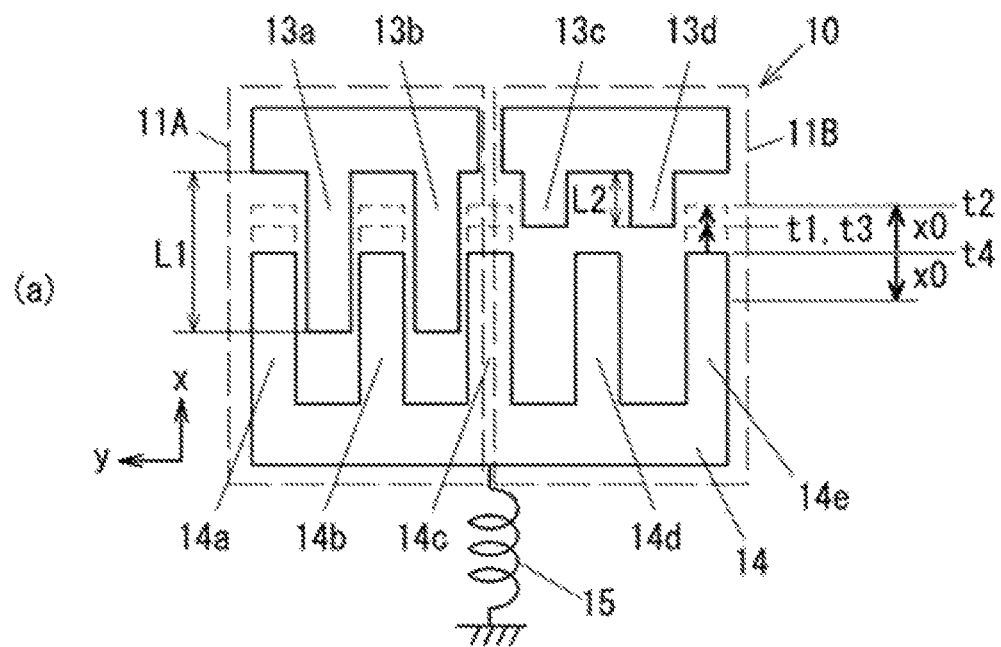
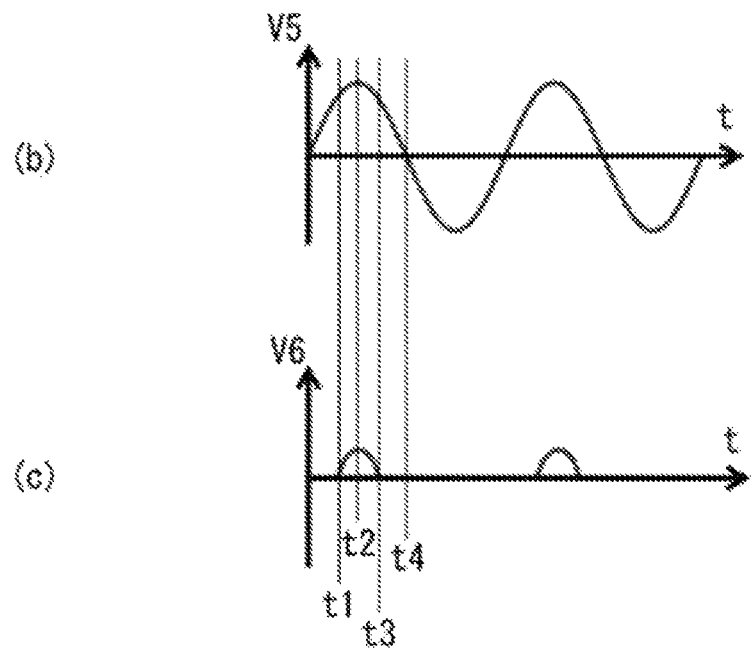

VIBRATION-DRIVEN ENERGY HARVESTING DEVICE AND VIBRATION-DRIVEN ENERGY HARVESTER

TECHNICAL FIELD

The present invention relates to a vibration-driven energy harvesting device and a vibration-driven energy harvester.

BACKGROUND ART

Among the energy harvesting technologies through which energy in the environment is harvested, a method whereby power is generated from an environmental vibration by a vibration-driven energy harvester has been attracting a great deal of attention in recent years (see, for instance, PTL1). The vibration-driven energy harvester described in PTL1 includes a fixed electrode and a movable electrode both having a comb tooth structure and generates power as vibration of the movable electrode causes a change in the area over which the fixed electrode and the movable electrode face opposite each other.

CITATION LIST

Patent Literature

PTL 1: Japanese Laid Open Patent Publication No. 2017-070163

SUMMARY OF INVENTION

Technical Problem

There is an issue yet to be effectively addressed in that when a power supply circuit, via which electric power is to be extracted from the vibration-driven energy harvester is connected to the vibration-driven energy harvester, the presence of the power supply circuit causes a change in the waveform of the output from the vibration-driven energy harvester, resulting in difficulty in accurately ascertaining the vibrating condition of the vibration-driven energy harvester.

Solution to Problem

According to a 1st aspect of the present invention, a vibration-driven energy harvesting device, comprises: a first vibration-driven energy harvesting assembly constituted with a first fixed comb tooth portion and a first movable comb tooth portion that are interdigitated with each other; a second vibration-driven energy harvesting assembly constituted with a second fixed comb tooth portion and a second movable comb tooth portion that are interdigitated with each other; a first output electrode connected to the first vibration-driven energy harvesting assembly; and a second output electrode connected to the second vibration-driven energy harvesting assembly, wherein: an output of the first vibration-driven energy harvesting assembly is different from an output of the second vibration-driven energy harvesting assembly.

According to a 2nd aspect of the present invention, a vibration-driven energy harvester used in the vibration-driven energy harvesting device according to the 1st aspect, comprises: the first vibration-driven energy harvesting assembly constituted with the first fixed comb tooth portion and the first movable comb tooth portion; and the second vibration-driven energy harvesting assembly constituted with the second fixed comb tooth portion and the second movable comb tooth portion, wherein: comb teeth included in the first fixed comb tooth portion and the second fixed comb tooth portion are each electrically insulated, with the first output electrode connected to the first fixed comb tooth portion and the second output electrode connected to the second fixed comb tooth portion, or comb teeth included in the first movable comb tooth portion and the second movable comb tooth portion are each electrically insulated, with the first output electrode connected to the first movable comb tooth portion and the second output electrode connected to the second movable comb tooth portion.

According to a 3rd aspect of the present invention, a vibration-driven energy harvester used in the vibration-driven energy harvesting device according to the 1st aspect, comprises: the first vibration-driven energy harvesting assembly constituted with the first fixed comb tooth portion and the first movable comb tooth portion; and the second vibration-driven energy harvesting assembly constituted with the second fixed comb tooth portion and the second movable comb tooth portion, wherein: the first fixed comb tooth portion and the second fixed comb tooth portion are electrically insulated, with the first output electrode connected to the first fixed comb tooth portion and the second output electrode connected to the second fixed comb tooth portion, or the first movable comb tooth portion and the second movable comb tooth portion are electrically insulated, with the first output electrode connected to the first movable comb tooth portion and the second output electrode connected to the second movable comb tooth portion.

According to a 4th aspect of the present invention, in the vibration-driven energy harvester according to the 3rd aspect, it is preferable that at least either of the first fixed comb tooth portion and the second fixed comb tooth portion, which are electrically insulated from each other, includes at least two electrically insulated fixed comb tooth groups, or at least either of the first movable comb tooth portion and the second movable comb tooth portion, which are electrically insulated from each other, includes at least two electrically insulated movable comb tooth groups.

According to a 5th aspect of the present invention, in the vibration-driven energy harvester according to any one of the 2nd through 4th aspects, it is preferable to comprise: the first vibration-driven energy harvesting assembly constituted with the first fixed comb tooth portion and the first movable comb tooth portion; and the second vibration-driven energy harvesting assembly constituted with the second fixed comb tooth portion and the second movable comb tooth portion, wherein: a total quantity of comb teeth included in the first fixed comb tooth portion and the first movable comb tooth portion is different from a total quantity of comb teeth included in the second fixed comb tooth portion and the second movable comb tooth portion.

According to a 6th aspect of the present invention, in the vibration-driven energy harvester according to any one of the 2nd through 4th aspects, it is preferable to comprise: the first vibration-driven energy harvesting assembly constituted with the first fixed comb tooth portion and the first movable comb tooth portion; and the second vibration-driven energy harvesting assembly constituted with the second fixed comb tooth portion and the second movable comb tooth portion, wherein: a comb tooth height of at least either of the first fixed comb tooth portion and the first movable comb tooth portion, which are interdigitated with each other, is different from a comb tooth height of the second fixed comb tooth portion and the second movable comb tooth portion, which are interdigitated with each other.

According to a 7th aspect of the present invention, in the vibration-driven energy harvester according to any one of the 2nd through 4th aspects, it is preferable to comprise: the first vibration-driven energy harvesting assembly constituted with the first fixed comb tooth portion and the first movable comb tooth portion; and the second vibration-driven energy harvesting assembly constituted with the second fixed comb tooth portion and the second movable comb tooth portion, wherein: a distance between comb teeth in the first fixed comb tooth portion and the first movable comb tooth portion, which are interdigitated with each other, is different from a distance between comb teeth in the second fixed comb tooth portion and the second movable comb tooth portion, which are interdigitated with each other.

According to an 8th aspect of the present invention, in the vibration-driven energy harvester according to any one of the 2nd through 4th aspects, it is preferable to comprise: the first vibration-driven energy harvesting assembly constituted with the first fixed comb tooth portion and the first movable comb tooth portion; and the second vibration-driven energy harvesting assembly constituted with the second fixed comb tooth portion and the second movable comb tooth portion, wherein: a comb tooth length of the second fixed comb tooth portion or the second movable comb tooth portion is set smaller than a comb tooth length of the first fixed comb tooth portion and the first movable comb tooth portion, and the second fixed comb tooth portion and the second movable comb tooth portion are set to be a non-interdigitated state when no vibration is occurring.

According to a 9th aspect of the present invention, in the vibration-driven energy harvester according to any one of the 2nd through 8th aspects, it is preferable that electrets are formed at at least either of comb teeth in the first vibration-driven energy harvesting assembly and comb teeth in the second vibration-driven energy harvesting assembly that are interdigitated with each other.

According to a 10th aspect of the present invention, a vibration-driven energy harvester used in the vibration-driven energy harvesting device according to the 1st aspect, comprises: the first vibration-driven energy harvesting assembly constituted with the first fixed comb tooth portion and the first movable comb tooth portion; and the second vibration-driven energy harvesting assembly constituted with the second fixed comb tooth portion and the second movable comb tooth portion, wherein: electrets are formed at at least either of comb teeth in the first vibration-driven energy harvesting assembly and comb teeth in the second vibration-driven energy harvesting assembly that are interdigitated with each other; and an amount of electret charge per unit area in the first vibration-driven energy harvesting assembly is different from an amount of electret charge per unit area in the second vibration-driven energy harvesting assembly.

Advantageous Effects of Invention

According to the present invention, the vibrating condition of a vibration-driven energy harvester can be ascertained with accuracy.

BRIEF DESCRIPTION OF DRAWINGS

FIG. 4 provides diagrams in reference to which the operation of the vibration-driven energy harvesting device achieved in the embodiment is to be explained.

FIG. 6 illustrates a vibration-driven energy harvesting device achieved in Variation 1.

FIG. 8 illustrates a vibration-driven energy harvesting device achieved in Variation 3.

DESCRIPTION OF EMBODIMENTS

Figure 1:
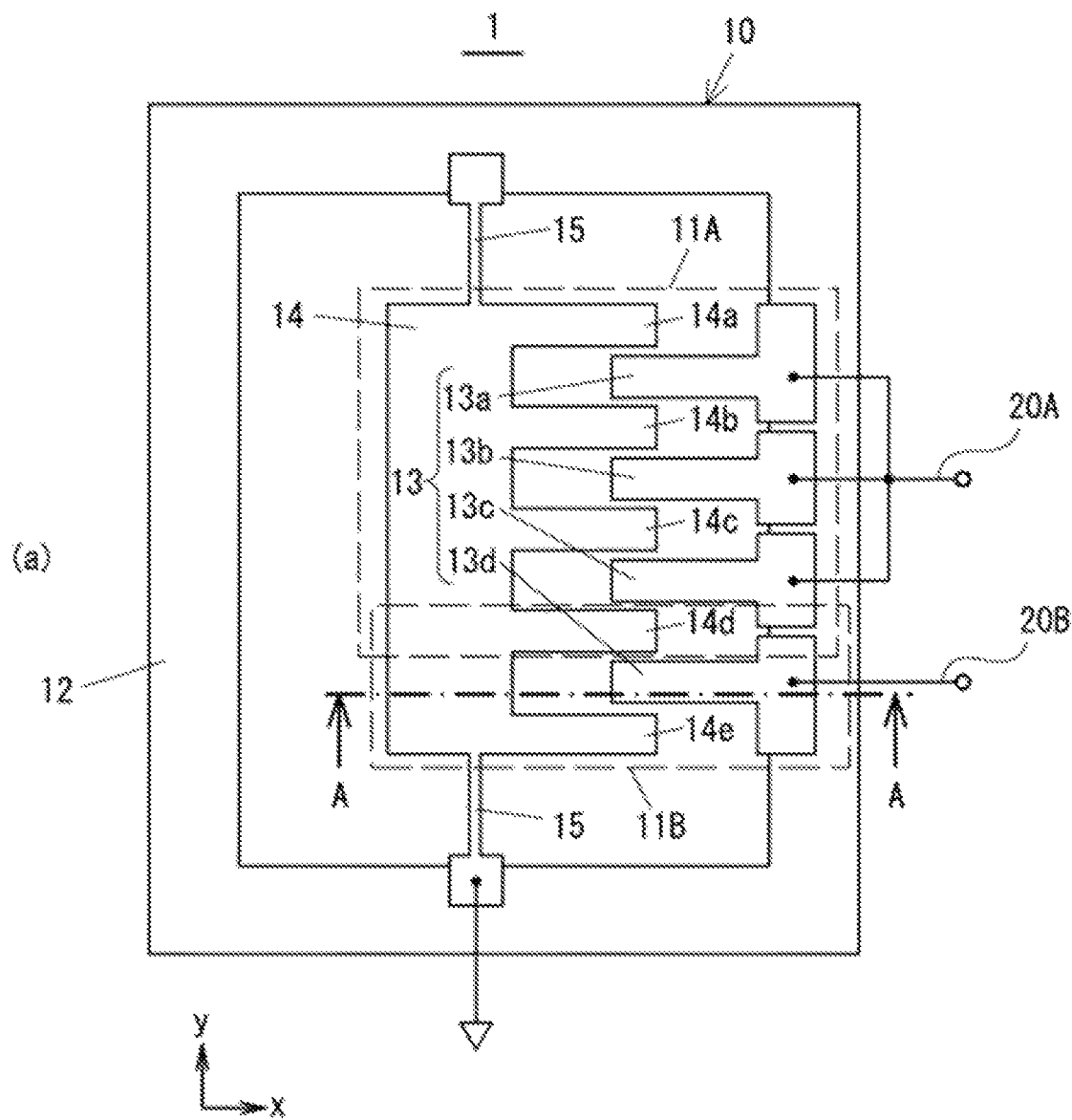
FIG. 1 schematically illustrates the structure of a vibration-driven energy harvesting device achieved in an embodiment of the present invention.

The following is a description of an embodiment of the present invention, given in reference to drawings. FIG. 1 schematically illustrates the structure of a vibration-driven energy harvesting device 1 achieved in the embodiment of the present invention, with FIG. 1(a) showing it in a plan view and FIG. 1(b) showing it in a sectional view taken over A-A in FIG. 1(a). The vibration-driven energy harvesting device 1 in FIG. 1 comprises a vibration-driven energy harvester 10 with two vibration-driven energy harvesting assemblies 11A and 11B disposed thereat, a power output electrode 20A connected to the vibration-driven energy harvesting assembly 11A and a monitor electrode 20B connected to the vibration-driven energy harvesting assembly 11B. The vibration-driven energy harvester 10 is formed through a standard MEMS (micro-electromechanical systems) machining technology by using, for instance, an SOI (silicon-on-insulator) substrate. Such an SOI substrate may be formed by laminating a lower Si layer where a handle layer is formed, a $SiO_2$ layer where a BOX layer is formed and an upper Si layer where a device layer is formed, one on top of another.

The vibration-driven energy harvester 10 includes a base 12, a fixed portion 13 at which fixed comb tooth electrodes 13a, 13b, 13c and 13d are formed, a movable portion 14 at which movable comb tooth electrodes 14a, 14b, 14c, 14d and 14e are formed, and elastic support portions 15 that elastically support the movable portion 14. The movable portion 14 is elastically supported relative to the base 12 via a pair of elastic support portions 15. It is to be noted that the numbers of fixed comb tooth electrodes and movable comb tooth electrodes are not limited to those shown in FIG. 1.

As the A-A sectional view in FIG. 1(b) indicates, the movable portion 14 that includes the movable comb tooth electrodes 14a through 14e and the fixed comb tooth electrodes 13a through 13d are formed with an upper Si layer 120 of an SOI substrate, with aluminum layers 131 and 141, which are electrically conductive layers, formed at the top surfaces of the movable portion 14 and the fixed comb tooth electrodes 13a through 13d respectively. It is to be noted that the aluminum layers 131 and 141 do not need to be formed so as to cover the entire top surfaces of the movable portion 14 and the fixed comb tooth electrodes 13a through 13d. The fixed comb tooth electrodes 13a through 13d are fixed, via an SiO$_2$ layer 110, to the base 12 constituted with a lower Si layer 100.

At least at either of the fixed comb tooth electrode 13a through 13d and the movable comb tooth electrodes 14a through 14e that are interdigitated, electrets are formed near the surfaces facing opposite the surfaces of the opposing electrodes. Thus, at least the surfaces of either the fixed comb tooth electrodes 13a through 13d or the movable comb tooth electrodes 14a through 14e that face the opposing electrodes are individually electrically charged. It is to be noted that electrets may be formed by adopting, for instance, the method disclosed in Japanese Laid Open Patent Publication No. 2016-149914.

The vibration-driven energy harvester 10 generates power as an external vibration causes the movable comb tooth electrodes 14a through 14e to vibrate along an x axis relative to the fixed comb tooth electrodes 13a through 13d. The power output electrode 20A is connected to the fixed comb tooth electrodes 13a, 13b and 13c constituting the vibration-driven energy harvesting assembly 11A, and is used as an output terminal through which an electric current generated by the vibration-driven energy harvesting assembly 11A is output. The monitor electrode 20B, connected to the fixed comb tooth electrode 13d, is used as an output terminal through which an electric current generated by the vibration-driven energy harvesting assembly 11B is output.

It is to be noted that in the embodiment illustrated in FIG. 1, the fixed comb tooth electrodes 13a through 13d in the vibration-driven energy harvester 10 are formed as elements separate from one another and are each electrically insulated. The comb tooth electrode group made up with the fixed comb tooth electrodes 13a through 13c constitutes a first fixed comb tooth portion whereas the fixed comb tooth electrode 13d constitutes a second fixed comb tooth portion. While the single fixed comb tooth electrode 13d by itself constitutes the second fixed comb tooth portion in the example presented in FIG. 1, the second fixed comb tooth portion may be made up with a plurality of fixed comb tooth electrodes and in such a case, the monitor electrode 20B will be connected to all these fixed comb tooth electrodes.

The fixed comb tooth electrodes 13a through 13c in the first fixed comb tooth portion are each electrically connected to the power output electrode 20A either inside the vibration-driven energy harvester 10 or outside the vibration-driven energy harvester 10. In this context, "electrical connection inside the vibration-driven energy harvester 10" means that wiring is formed entirely within the vibration-driven energy harvester 10. "Electric connection outside the vibration-driven energy harvester 10" means that the fixed comb tooth electrodes 13a through 13c are not electrically connected within the vibration-driven energy harvester 10 and that the fixed comb tooth electrodes 13a through 13c are electrically connected via wiring at a circuit substrate on which the vibration-driven energy harvester 10 is mounted. The fixed comb tooth electrode 13d in the second fixed comb tooth portion is connected to the monitor electrode 20B.

Figure 2:
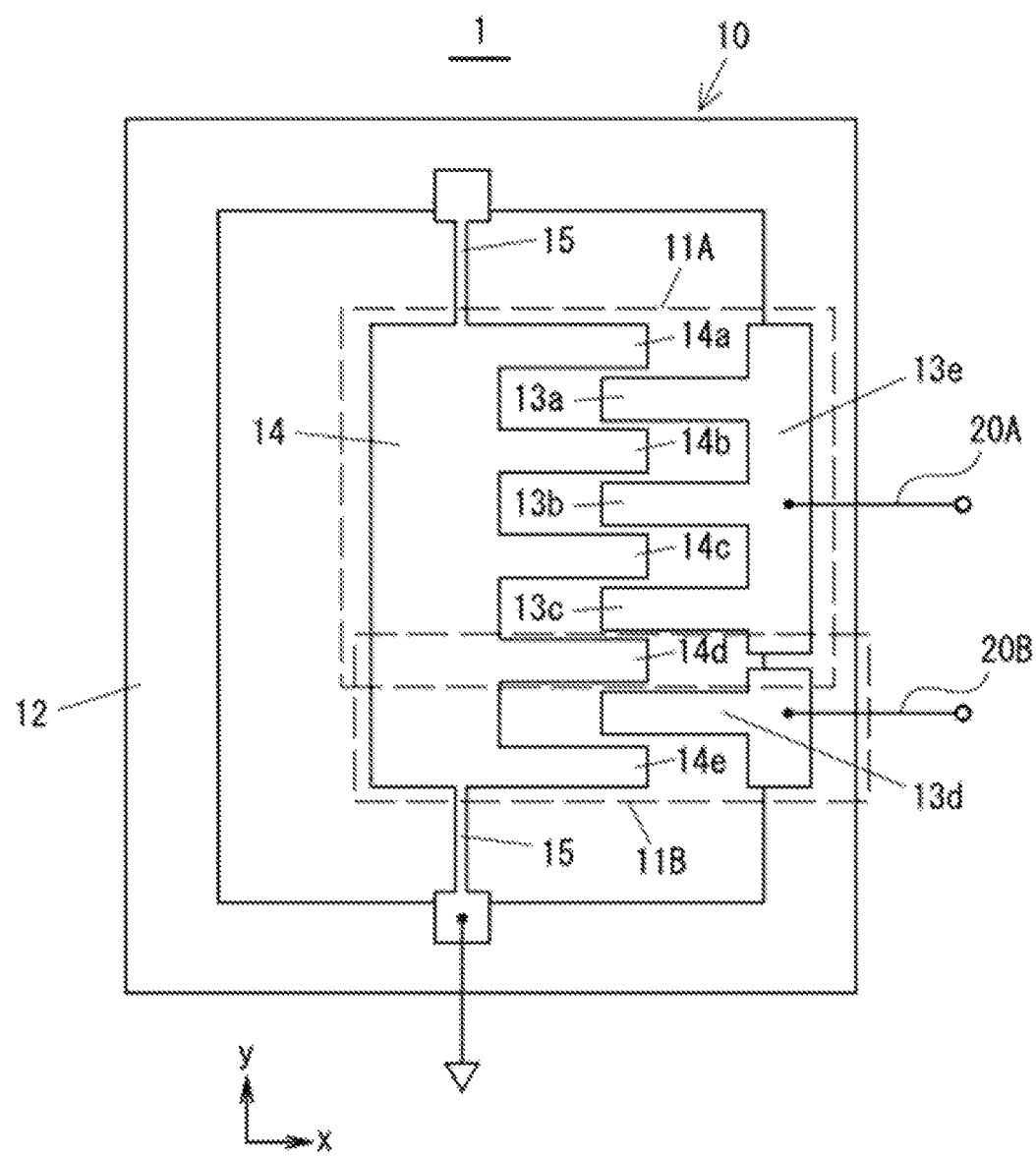
FIG. 2 illustrates another structure that may be adopted for a first fixed comb tooth portion.

While the fixed comb tooth electrodes 13a through 13d are formed as separate elements in the example presented in FIG. 1, the fixed comb tooth electrodes 13a through 13c may instead be formed as an integrated unit, as illustrated in FIG. 2. In the example presented in FIG. 2, the fixed comb tooth electrodes 13a through 13c constituting the first fixed comb tooth portion are connected via a connecting portion 13e, and the power output electrode 20A is connected to the connecting portion 13e. Other structural features are similar to those of the vibration-driven energy harvesting device 1 in FIG. 1. The structure in FIG. 1 makes it possible to adjust the number of fixed comb tooth electrodes in the second fixed comb tooth portion, which is connected to the monitor electrode 20B, in correspondence to the required level of monitor signal output or the purpose of use of the monitor signal.

Figure 3:
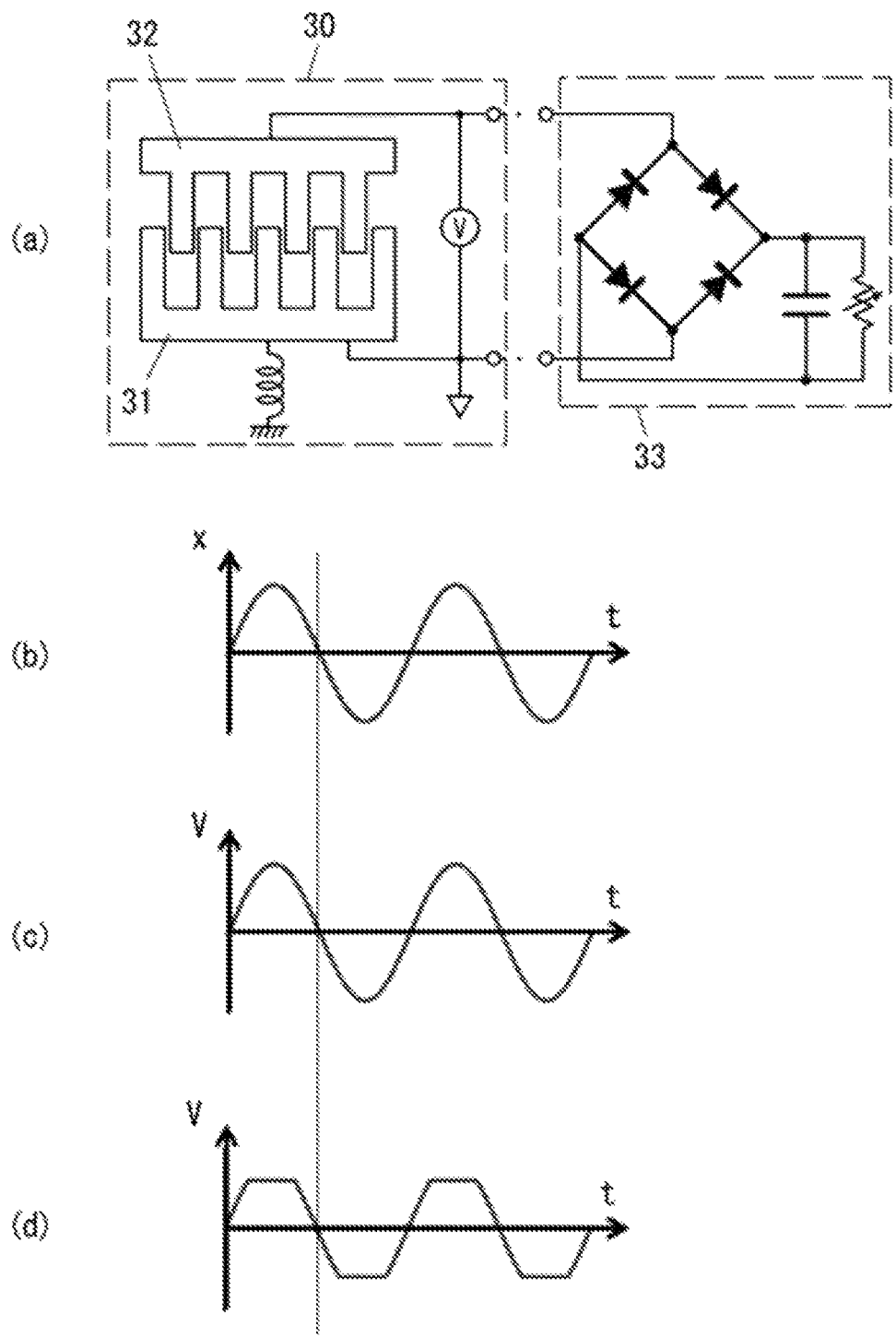
FIG. 3 illustrates a comparison example to the embodiment.

FIG. 3 presents a comparison example to the embodiment. While two outputs can be extracted via the power output electrode 20A and the monitor electrode 20B in the vibration-driven energy harvesting device 1 in the embodiment, a vibration-driven energy harvesting device 30 in FIG. 3(a) assumes a single-output structure that includes a single vibration-driven energy harvesting assembly, constituted with a set of a movable comb tooth portion 31 and a fixed comb tooth portion 32, and an electric current is output from the single vibration-driven energy harvesting assembly. FIG. 3(b) indicates an amplitude x of the vibration of the movable comb tooth portion 31, whereas FIG. 3(c) indicates an open-circuit voltage V present between the movable comb tooth portion 31 and the fixed comb tooth portion 32 in the vibrating condition shown in FIG. 3(b).

As the movable comb tooth portion 31 moves and the size of the area over which the movable comb tooth electrodes and the fixed comb tooth electrodes in the interdigitated state changes, a voltage is generated between the movable comb tooth electrodes and the fixed comb tooth electrodes due to movement of electric charges in the comb tooth electrodes. As a result, the open-circuit voltage V assumes a waveform synchronous with the amplitude x of the vibration of the movable comb tooth portion 31, which has an amplitude proportional to the amplitude x. As the voltage output from a rectifier circuit rises to the level of the rated capacitor voltage when a power supply circuit 33 is connected to the vibration power generation device 30, a behavior whereby an electric current flows via a resistor while the voltage is constant is observed. As a result, the voltage becomes saturated once it reaches the rated capacitor voltage level, and the voltage V between the terminals does not achieve a waveform having an amplitude proportional to the amplitude x at the movable comb tooth portion 31, as FIG. 3(d) indicates. This means that the vibrating condition of the movable comb tooth portion 31 cannot be accurately ascertained based upon the voltage signal V in FIG. 3(d).

FIG. 4 illustrates a state achieved by connecting the power supply circuit 33 to the vibration-driven energy harvesting device 1 shown in FIG. 2. As FIG. 2 indicates, the movable comb tooth electrodes in the vibration-driven energy harvesting assembly 11A, which includes the power output electrode 20A, and the movable comb tooth electrodes in the vibration energy harvesting assembly 11B, which includes the monitor electrode 20B, are disposed in the single movable portion 14. Thus, even with the power supply circuit 33 connected, a voltage V2 at the monitor electrode 20B indicated in FIG. 4(d) assumes a waveform with an amplitude that is proportional to the amplitude x at the movable portion 14 indicated in FIG. 4(b). A voltage V1 at the power output electrode 20A, on the other hand, has a waveform such as that indicated in FIG. 4(c) due to the influence of the power supply circuit 33.

While the fixed comb tooth portion 32 includes four fixed comb tooth electrodes in the structure described in reference to FIG. 3(a), the vibration-driven energy harvesting assembly 11B in FIG. 4(a) includes a single fixed comb tooth electrode. This means that the amplitude of the voltage waveform in FIG. 4(d) is smaller than the amplitude of the voltage waveform in FIG. 3(c). In other words, in the vibration-driven energy harvesting device 1 according to the embodiment a smaller number of comb tooth electrodes is disposed in the vibration energy harvesting assembly 11B for the monitor signal in comparison to the number of fixed comb tooth electrodes in the vibration energy harvesting assembly 11A for electric power. In this manner, a monitor signal can be obtained while minimizing the extent to which the power output from the power output electrode 20A is lowered.

Figure 5:
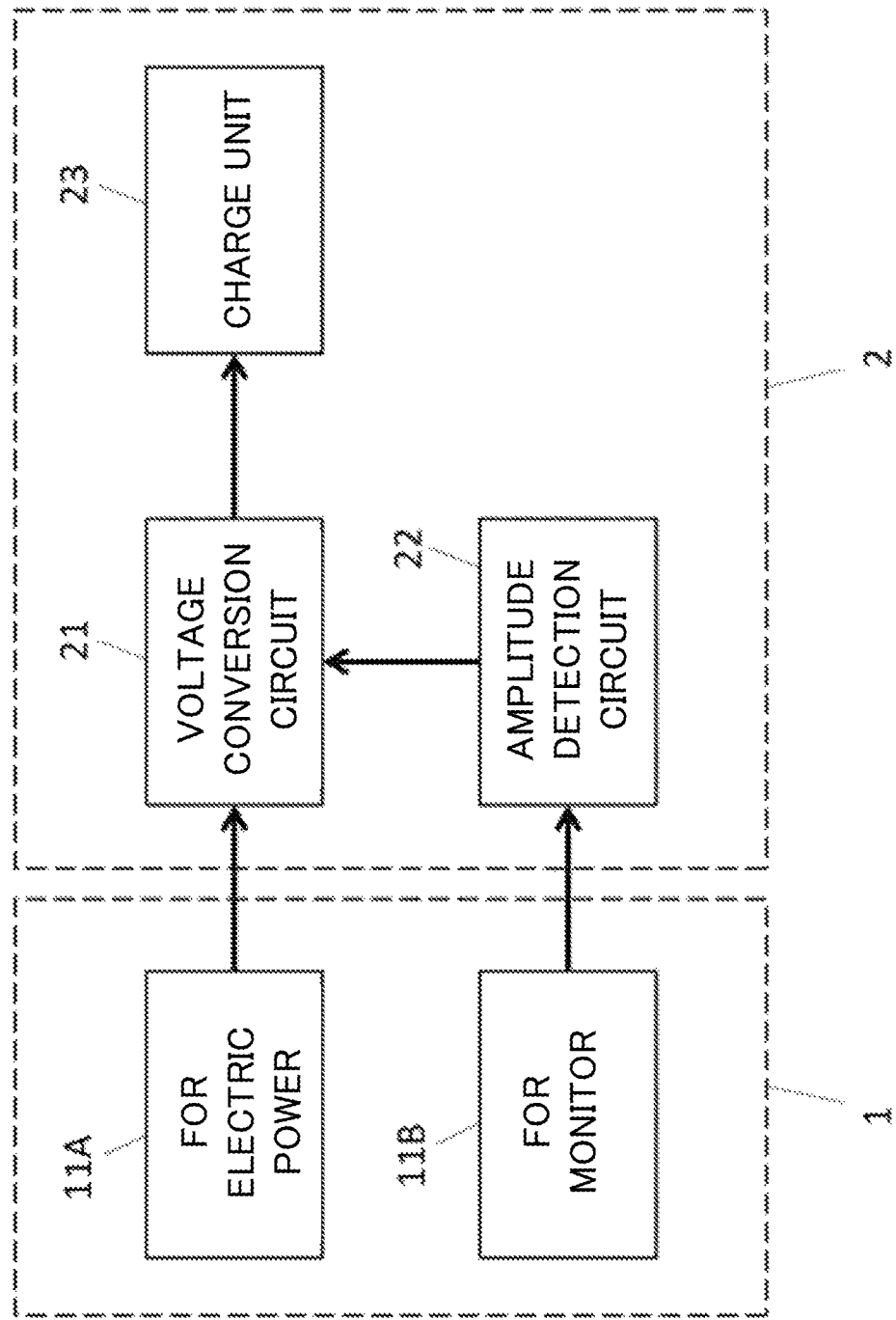
FIG. 5 is a block diagram pertaining to a power supply system achieved by employing the vibration-driven energy harvesting device.

FIG. 5 is a block diagram of a power supply system achieved in conjunction with the vibration-driven energy harvesting device 1, and presents an example of an application for the output signal provided through the monitor electrode 20B. The output from the vibration-driven energy harvesting assembly 11A for electric power is input to a voltage conversion circuit 21 in a power supply unit 2. The power supply unit 2 includes an amplitude detection circuit 22 and a charge unit 23 in addition to the voltage conversion circuit 21. The output from the vibration-driven energy harvesting assembly 11B for the monitor signal is input to the amplitude detection circuit 22 and amplitude information indicating the amplitude detected by the amplitude detection circuit 22 is input to the voltage conversion circuit 21. Based upon the amplitude information input thereto from the amplitude detection circuit 22, the voltage conversion circuit 21 executes voltage conversion so that power from the vibration-driven energy harvesting assembly 11A is output, for instance, with high efficiency, and outputs the voltage resulting from the conversion to the charge unit 23. While accurate amplitude information on the output from the vibration-driven energy harvesting assembly 11A must be obtained for these purposes, accurate amplitude information can be obtained by utilizing the output from the vibration-driven energy harvesting assembly 11B in the embodiment.

Variation 1

FIG. 6 illustrates Variation 1 of the vibration-driven energy harvesting device 1. FIG. 6(a) provides a schematic diagram illustrating structures adopted for movable comb tooth electrodes and fixed comb tooth electrodes disposed in a vibration-driven energy harvester 10. In the structure illustrated in FIG. 4, the number of fixed comb tooth electrodes in the vibration-driven energy harvesting assembly 11B is set smaller than the number of fixed comb tooth electrodes in the vibration-driven energy harvesting assembly 11A so as to ensure that the amplitude of the monitor signal obtained via the vibration-driven energy harvesting assembly 11B is smaller than the amplitude of the output signal obtained via the vibration-driven energy harvesting assembly 11A.

In Variation 1, different outputs are achieved for the vibration-driven energy harvesting assembly 11A and the vibration-driven energy harvesting assembly 11B by setting the distance between the fixed comb tooth electrodes and the movable comb tooth electrodes in the vibration-driven energy harvesting assembly 11A different from the distance between the fixed comb tooth electrodes and the movable comb tooth electrodes in the vibration-driven energy harvesting assembly 11B, thus achieving different capacitances at the vibration-driven energy harvesting assembly 11A and the vibration-driven energy harvesting assembly 11B, instead of disposing different numbers of fixed comb tooth electrodes in the vibration-driven energy harvesting assemblies 11A and 11B. FIG. 6(a) shows that a lateral width W2 of the fixed comb tooth electrodes 13c and 13d in the vibration-driven energy harvesting assembly 11B is set smaller than a lateral width W1 of the fixed comb tooth electrodes 13a and 13b in the vibration-driven energy harvesting assembly 11A. As a result, distances d1 and d2 between the fixed comb tooth electrodes and the movable comb tooth electrodes in the vibration-driven energy harvesting assemblies 11A and 11B achieve a relationship expressed as; d1<d2. It is to be noted that instead of setting the lateral width of the fixed comb tooth electrodes 13c and 13d in the vibration-driven energy harvesting assembly 11B to W2, the lateral width of movable comb tooth electrodes 14d and 14e may be set to W2.

It is to be also noted that the vibration-driven energy harvesting assembly 11A and the vibration-driven energy harvesting assembly 11B include equal numbers of fixed comb tooth electrodes in the illustration provided in FIG. 6(a) so as to clearly demonstrate that the outputs from the vibration-driven energy harvesting assembly 11A and the vibration-driven energy harvesting assembly 11 are differentiated by having different lateral widths set for the respective fixed comb tooth electrodes. However, even when different lateral widths are set for the fixed comb tooth electrodes, it is desirable to dispose fixed comb tooth electrodes in the vibration-driven energy harvesting assembly 11B in a quantity such as that in FIG. 4(a), in order to maximize the output of the vibration-driven energy harvesting assembly 11A.

When the lateral with W2 of the fixed comb tooth electrodes 13c and 13d is set so that W2<W1 as illustrated in FIG. 6(a), the distance between the side surfaces of the fixed comb tooth electrodes 13c and 13d and the side surfaces of the movable comb tooth electrodes 14c through 14e increases, and under such circumstances, the capacitance at the vibration-driven energy harvesting assembly 11B is smaller in comparison with the capacitance at the vibration-driven energy harvesting assembly 11A. Since the extent of electric charge movement occurring as the movable portion 14 vibrates is greater where the capacitance is greater, an open-circuit voltage V4 at the vibration-driven energy harvesting assembly 11B in FIG. 6(c) has a smaller amplitude in comparison with the amplitude of an open-circuit voltage V3 at the vibration-driven energy harvesting assembly 11A shown in FIG. 6(b). The amplitudes of the open-circuit voltages V3 and V4 change proportionally to the amplitude of the vibration of the movable portion 14.

It is to be noted that while an explanation has been given in reference to FIG. 6 on an example in which a plurality of fixed comb tooth electrodes are divided into two groups as indicated in FIG. 2, the output of the vibration-driven energy harvesting assembly 11A and the output of the vibration-driven energy harvesting assembly 11B can be differentiated from each other when a plurality of fixed comb tooth electrodes are separated from one another as illustrated in FIG. 1, as well, by varying the distances between the comb teeth in the vibration-driven energy harvesting assembly 11A and in the vibration-driven energy harvesting assembly 11B.

Variation 2

Figure 7:
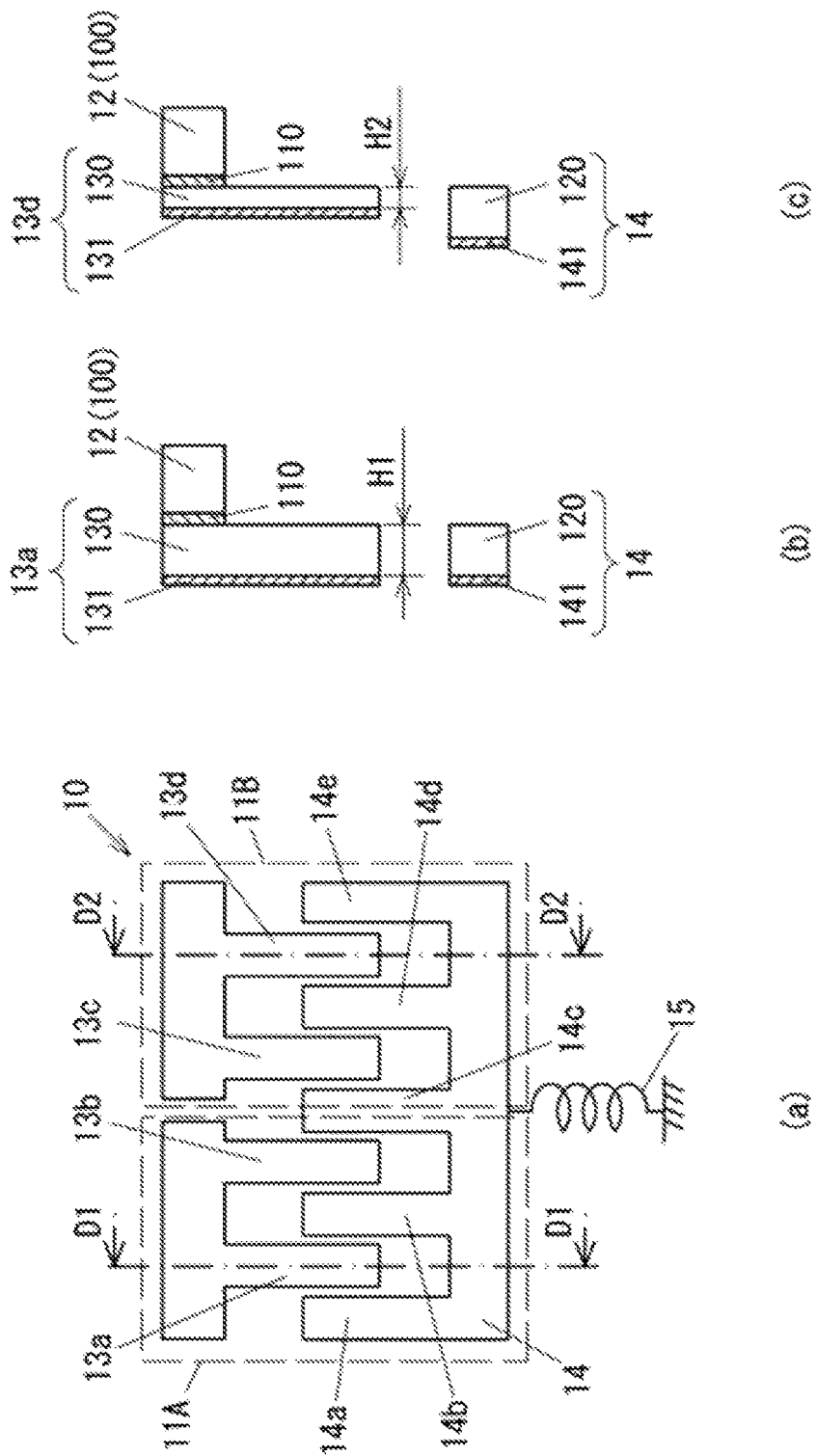
FIG. 7 illustrates a vibration-driven energy harvesting device achieved in Variation 2.

FIG. 7 illustrates Variation 2 of the vibration-driven energy harvesting device 1. FIG. 7 provides schematic diagrams illustrating structures adopted for movable comb tooth electrodes and fixed comb tooth electrodes disposed in a vibration-driven energy harvester 10. FIG. 7(a) shows the vibration-driven energy harvester 10 in a plan view, FIG. 7(b) shows it in a sectional view taken over D1-D1 and FIG. 7(c) shows it in a sectional view taken over D2-D2.

In Variation 2, the fixed comb tooth electrodes in the vibration-driven energy harvesting assembly 11A assume a height different from the height of the fixed comb tooth electrodes in the vibration-driven energy harvesting assembly 11B so as to achieve different size areas over which the movable electrodes and the fixed electrodes face opposite each other in the vibration-driven energy harvesting assembly 11A and in the vibration-driven energy harvesting assembly 11B, and ultimately to differentiate the outputs from the vibration-driven energy harvesting assemblies 11A and 11B. In the example presented in FIG. 7, a height H2 (see FIG. 7(c)) of fixed comb tooth electrodes 13c and 13d in the vibration-driven energy harvesting assembly 11B is set smaller than a height H1 (see FIG. 7(b)) of fixed comb tooth electrodes 13a and 13b in the vibration-driven energy harvesting assembly 11A.

It is to be noted that the vibration-driven energy harvesting assembly 11A and the vibration-driven energy harvesting assembly 11B include equal numbers of fixed comb tooth electrodes in the illustration provided in FIG. 7 so as to clearly demonstrate that the outputs from the vibration-driven energy harvesting assembly 11A and the vibration-driven energy harvesting assembly 11B are differentiated by having different heights set for the respective fixed comb tooth electrodes. However, even when different heights are set for the fixed comb tooth electrodes, it is desirable to dispose fixed comb tooth electrodes in the vibration-driven energy harvesting assembly 11B in a quantity such as that in FIG. 4(a), in order to maximize the output of the vibration-driven energy harvesting assembly 11A.

When the height H2 of the fixed comb tooth electrodes 13c and 13d is set so that H2<H1, the area over which the fixed comb tooth electrodes and the movable comb tooth electrodes face opposite each other in the vibration-driven energy harvesting assembly 11B is smaller than the area over which the fixed comb tooth electrodes and the movable tooth electrodes face opposite each other in the vibration-driven energy harvesting assembly 11A, as illustrated in FIG. 7. This means that as the movable portion 14 becomes displaced, the area over which the fixed comb tooth electrodes and the movable comb tooth electrodes face opposite each other in the vibration-driven energy harvesting assembly 11B changes to a smaller extent in comparison with the extent to which the area over which the fixed comb tooth electrodes and the movable comb tooth electrodes face opposite each other changes in the vibration-driven energy harvesting assembly 11A. This results in the vibration-driven energy harvesting assembly 11B having an open-circuit voltage lower than the open-circuit voltage at the vibration-driven energy harvesting assembly 11A, as in Variation 1. The amplitudes of both open-circuit voltages change proportionally to the amplitude of the vibration of the movable portion 14.

While the height of the fixed comb tooth electrodes is set to different values for the vibration-driven energy harvesting assembly 11A and the vibration-driven energy harvesting assembly 11B in the example presented in FIG. 7, different heights may be set for the movable comb tooth electrodes instead. In addition, while FIG. 7(c) only shows the height of the fixed comb tooth electrode 13d set to H2 in the vibration-driven energy harvesting assembly 11B in FIG. 7(c), the height of the movable comb tooth electrodes 14d and 14e, too, may be set to H2.

It is to be noted that while an explanation has been given in reference to FIG. 7 on an example in which a plurality of fixed comb tooth electrodes are divided into two groups as indicated in FIG. 2, the output of the vibration-driven energy harvesting assembly 11A and the output of the vibration-driven energy harvesting assembly 11B can be differentiated from each other when a plurality of fixed comb tooth electrodes are separated from one another as illustrated in FIG. 1, as well, by differentiating the comb tooth height in the vibration-driven energy harvesting assembly 11A from the comb tooth height in the vibration-driven energy harvesting assembly 11B.

Variation 3

FIG. 8 illustrates Variation 3 of the vibration-driven energy harvesting device 1. FIG. 8(a) provides a schematic diagram illustrating structures adopted for movable comb tooth electrodes and fixed comb tooth electrodes disposed in a vibration-driven energy harvester 10. FIG. 8(b) shows the waveform of an open-circuit voltage V5 at the vibration-driven energy harvesting assembly 11A, whereas FIG. 8(c) shows the waveform of an open-circuit voltage V6 at the vibration-driven energy harvesting assembly 11B. In Variation 3, fixed comb tooth electrodes take on different lengths in the vibration-driven energy harvesting assembly 11A and in the vibration-driven energy harvesting assembly 11B, instead of fixed comb tooth electrodes disposed in different numbers in the vibration-driven energy harvesting assembly 11A and in the vibration-driven energy harvesting assembly 11B, so as to differentiate the timing with which the movable electrodes and the fixed electrodes start to become interdigitated with each other and to ultimately achieve different outputs for the vibration-driven energy harvesting assemblies 11A and 11B.

In FIG. 8(a) a length L2 of fixed comb tooth electrodes 13c and 13d in the vibration-driven energy harvesting assembly 11B is set smaller than a length L1 of fixed comb tooth electrodes 13a and 13b in the vibration-driven energy harvesting assembly 11A. It is to be noted that the vibration-driven energy harvesting assembly 11A and the vibration-driven energy harvesting assembly 11B include equal numbers of fixed comb tooth electrodes in the illustration provided in FIG. 8(a) so as to clearly demonstrate that the outputs from the vibration-driven energy harvesting assembly 11A and the vibration-driven energy harvesting assembly 11 are differentiated by having different lengths set for the respective fixed comb tooth electrodes. However, even when different lengths are set for the fixed comb tooth electrodes, it is desirable to dispose fixed comb tooth electrodes in the vibration-driven energy harvesting assembly 11B in a quantity such as that in FIG. 4(a), in order to maximize the output of the vibration-driven energy harvesting assembly 11A.

When the lengths L1 and L2 of the fixed comb tooth electrodes 13a through 13d are set so that L2<L1 as indicated in FIG. 8(a), the open-circuit voltage V5 at the vibration-driven energy harvesting assembly 11A takes on a waveform such as that shown in FIG. 8(b) and the open-circuit voltage V6 at the vibration-driven energy harvesting assembly 11B takes on a waveform such as that shown in FIG. 8(c), both in synchronization with the amplitude of the vibration of the movable portion 14.

The position taken by the movable portion 14 along the x direction in FIG. 8(a) represents a state in which the electret-induced electric power is in balance with the elastic force imparted from the elastic support portions 15. In the state illustrated in FIG. 8(a), the fixed comb tooth electrodes 13c and 13d and the movable comb tooth electrodes 14c through 14e are not interdigitated in the vibration-driven energy harvesting assembly 11B. x0 denotes the amplitude of the vibration of the movable portion 14. When t=0 in FIGS. 8(b) and 8(c), the movable portion 14 is at the in-balance position.

Following the time point t=0, as the movable portion 14 starts moving toward the positive side along the x-axis, the open-circuit voltage V5 at the vibration-driven energy harvesting assembly 11A starts to rise, as indicated in FIG. 8(b). However, a charge migration does not occur in the vibration-driven energy harvesting assembly 11B, where the fixed comb tooth electrodes 13c and 13d and the movable comb tooth electrodes 14c through 14e are not interdigitated and thus, the open-circuit voltage V6 at the vibration-driven energy harvesting assembly 11B remains at 0.

As the movable portion 14 reaches a position indicated with the reference sign t1 in FIG. 8(a) at a time point t1, the fixed comb tooth electrodes 13c and 13d and the movable comb tooth electrode 14c through 14e become interdigitated in the vibration-driven energy harvesting assembly 11B. Following the time point t1, the areas over which the fixed comb tooth electrodes and the movable comb tooth electrodes face opposite each other increase both in the vibration-driven energy harvesting assembly 11A and in the vibration-driven energy harvesting assembly 11B, causing both the open-circuit voltage V5 and the open-circuit voltage V6 to rise.

As the movable portion 14 moves upward in the figure, the amplitude of its displacement reaches x0 at a time point t2. At this time, the open-circuit voltages V5 and V6 at the vibration-driven energy harvesting assemblies 11A and 11B each climb to a positive peak. Beyond the time point t2, the movable portion 14 moves toward the negative side along the x axis, and thus, the areas over which the fixed comb tooth electrodes and the movable comb tooth electrodes face opposite each other decrease both in the vibration-driven energy harvesting assembly 11A and in the vibration-driven energy harvesting assembly 11B. As a result, the open-circuit voltages V5 and V6 decrease.

After the movable portion 14 starts moving downward in the figure, the area over which the fixed comb tooth electrodes and the movable comb tooth electrodes face each other in the vibration-driven energy harvesting assembly 11B is reduced to 0 at a time point t3, and since the area remains at 0, the open-circuit voltage V6 remains at 0 beyond the time point t3. The area over which the fixed comb tooth electrodes and the movable comb tooth electrodes face opposite each other continues to decrease in the vibration-driven energy harvesting assembly 11A, which causes the open-circuit voltage V5 to decrease while sustaining a positive value. Then, at a time point t4, the movable portion 14 reaches an in-balance position, and beyond the time point t4, the direction along which the electric charge migrates is reversed and the open-circuit voltage V5 thus takes on a negative value.

Since the length L2 of the fixed comb tooth electrodes 13c and 13d in the vibration-driven energy harvesting assembly 11B is set smaller than the length L1 of the fixed comb tooth electrodes 13a and 13b in the vibration-driven energy harvesting assembly 11A as described above, V6≠0 is true for the open-circuit voltage V6 only over a range near the highest peak of the open-circuit voltage V5. Namely, a monitor signal is output only over a range around the maximum output peak, in which the fixed comb tooth electrodes 13c and 13d and the movable comb tooth electrodes 14c through 14e are in an interdigitated state in the vibration-driven energy harvesting assembly 11B.

While the comb tooth length at the fixed comb tooth electrodes is set to L1 in the vibration-driven energy harvesting assembly 11A and the comb tooth length at the fixed comb tooth electrodes is set to L2 in the vibration-driven energy harvesting assembly 11B in the structure illustrated in FIG. 8, comb tooth lengths at the movable tooth electrodes may instead be set to L1 and L2. For instance, the length of the movable comb tooth electrodes 14a through 14c may be set to L1 and the length of the movable comb tooth electrodes 14d and 14e may be set L2.

It is to be noted that while an example in which a plurality of fixed comb tooth electrodes are divided into two groups, as indicated in FIG. 2, has been explained in reference to FIG. 8, the output from the vibration-driven energy harvesting assembly 11A and the output from the vibration-driven energy harvesting assembly 11B can be differentiated in a structure with a plurality of fixed comb tooth electrodes formed as elements separate from one another as illustrated in FIG. 1, as well, by setting the comb tooth length of the fixed comb tooth electrodes in the vibration-driven energy harvesting assembly 11B smaller than the comb tooth length of the fixed comb tooth electrodes in the vibration-driven energy harvesting assembly 11A and by setting the vibration-driven energy harvesting assembly 11B to be in a non-interdigitated state when there is no vibration.

Variation 4

Figure 9:
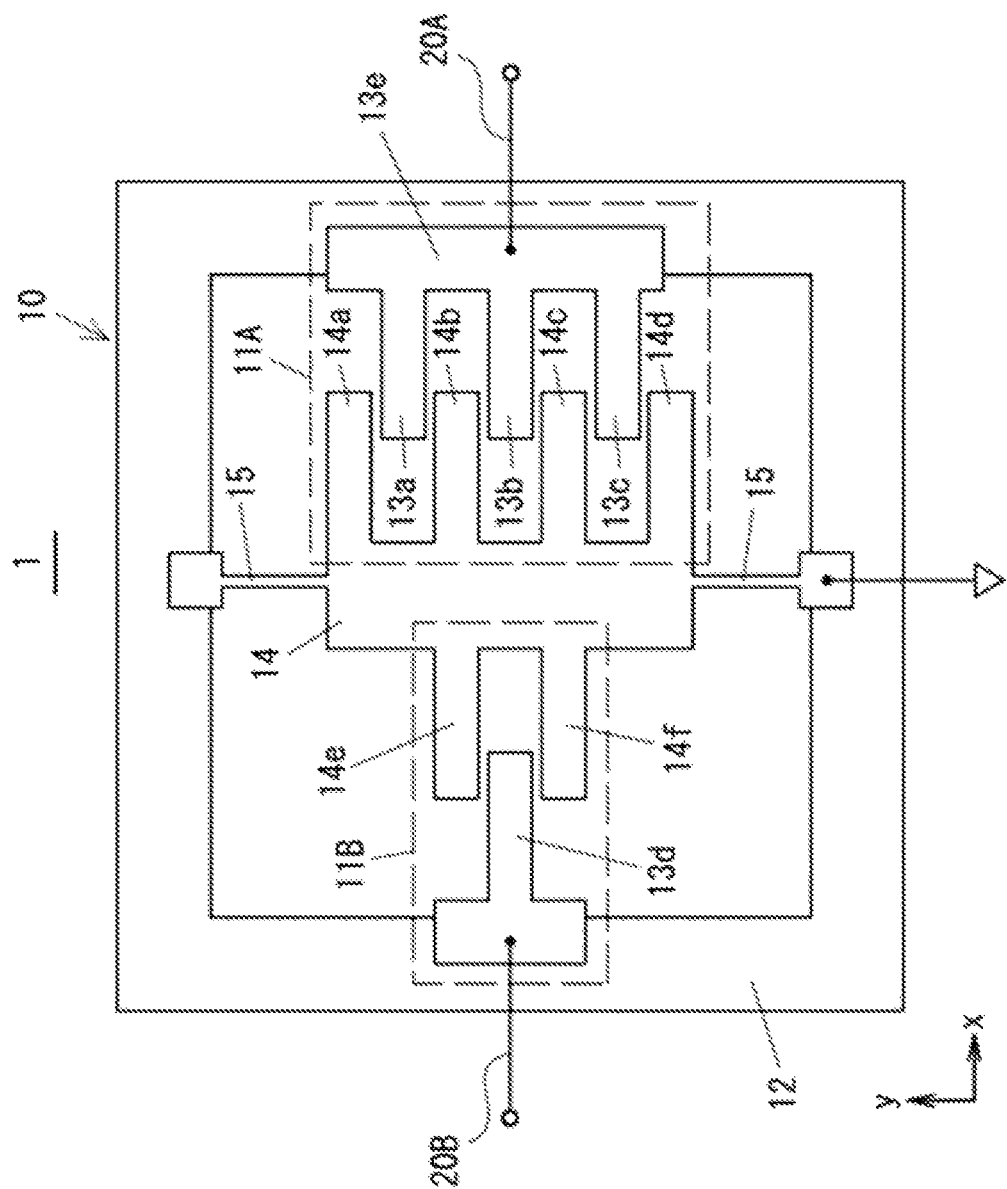
FIG. 9 illustrates a vibration-driven energy harvesting device achieved in Variation 4.

FIG. 9 illustrates Variation 4 of the vibration-driven energy harvesting device 1. While the movable comb tooth electrodes in the vibration-driven energy harvesting assemblies 11A and 11B are all disposed at the movable portion 14 on the right side thereof in the structure illustrated in FIG. 2, movable comb tooth electrodes 14d and 14e in the vibration-driven energy harvesting assembly 11B are disposed on the left side of the movable portion 14 as indicated in the figure in Variation 4. The vibration-driven energy harvesting assembly 11A is configured with movable comb tooth electrodes 14a through 14d disposed on the right side of the movable portion 14 and fixed comb tooth electrodes 13a through 13c that are interdigitated with the movable comb tooth electrodes 14a through 14d. The vibration-driven energy harvesting assembly 11B is configured with the movable comb tooth electrodes 14e and 14f disposed on the left side of the movable portion 14 and a fixed comb tooth electrode 13d that is interdigitated with the movable comb tooth electrodes 14e and 14f.

As the movable portion 14 becomes displaced toward the positive side along the x axis, the area over which the movable comb tooth electrodes 14a through 14d and the fixed comb tooth electrodes 13a through 13c face opposite each other in the vibration-driven energy harvesting assembly 11A increases and the area over which the movable comb tooth electrodes 14e and 14f face opposite the fixed comb tooth electrode 13d in the vibration-driven energy harvesting assembly 11B decreases. In contrast, as the movable portion 14 becomes displaced toward the negative side along the x axis, the area over which the movable comb tooth electrodes 14a through 14d and the fixed comb tooth electrodes 13a through 13c face opposite each other in the vibration-driven energy harvesting assembly 11A decreases and the area over which the movable comb tooth electrodes 14e and 14f face opposite the fixed comb tooth electrode 13d in the vibration-driven energy harvesting assembly 11B increases. This means that while the phase of the waveform of the open-circuit voltage at the vibration-driven energy harvesting assembly 11B is offset by 180° relative to the waveform of the open-circuit voltage at the vibration-driven energy harvesting assembly 11A, the waveforms of the open-circuit voltages at the vibration-driven energy harvesting assemblies 11A and 11B are both synchronous with the amplitude of the movable portion 14. Namely, a signal output from the monitor electrode 20B in the vibration-driven energy harvesting assembly 11B can be utilized as a monitor signal for monitoring the power output from the vibration-driven energy harvesting assembly 11A, as in the embodiment described earlier.

It is to be noted that while a plurality of fixed comb tooth electrodes are divided into two groups in the example described in reference to FIG. 9, a plurality of fixed comb tooth electrodes may instead be formed as elements separate from one another, as in FIG. 1, and the separate fixed comb tooth electrodes may then be disposed, one group on the right side and the other group on the left side of the movable portion 14 in the figure.

Variation 5

Figure 10:
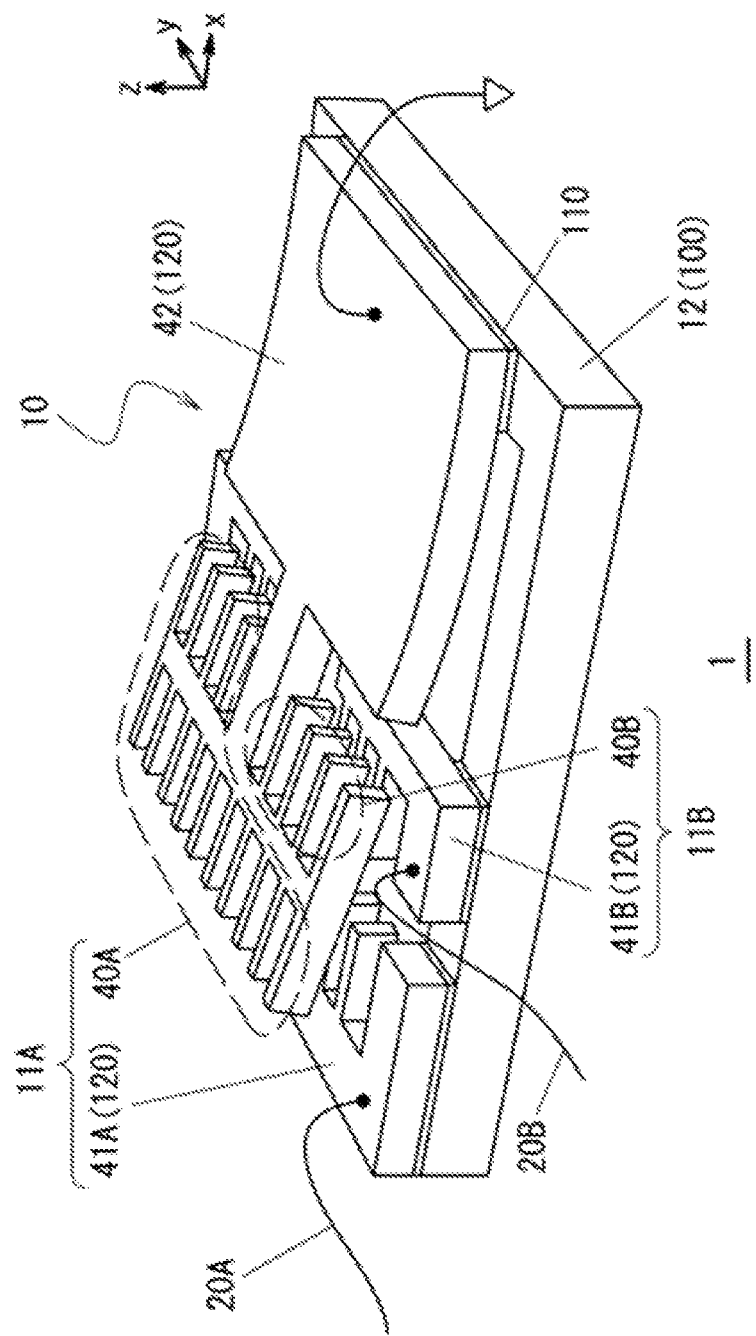
FIG. 10 illustrates a vibration-driven energy harvesting device achieved in Variation 5.

FIG. 10 illustrates Variation 5 of the vibration-driven energy harvesting device 1. While the vibration-driven energy harvester 10 in the embodiment and the variations thereof described above adopts a structure in which the movable comb tooth electrodes are displaced relative to the fixed comb tooth electrodes within a single plane, an alternative structure, in which movable comb tooth electrodes undergo out-of-plane vibration, as shown in FIG. 10, may be adopted.

On a base 12 formed with a lower Si layer 100 of an SOI substrate, a first fixed comb tooth portion 41A, a second fixed comb tooth portion 41B and a cantilever 42, all formed with an upper Si layer 120, are disposed via an $SiO_2$ layer 110 in FIG. 10. At the cantilever 42, a first movable comb tooth portion 40A to interdigitate with the first fixed comb tooth portion 41A and a second movable comb tooth portion 40B to interdigitate with the second fixed comb tooth portion 41B are formed. A power output electrode 20A is connected to the first fixed comb tooth portion 41A, whereas a monitor electrode 20B is connected to the second fixed comb tooth portion 41B. It is to be noted that the figure does not include an illustration of the conductive layers (equivalent to the aluminum layers 131 and 141 in FIG. 1) formed at the upper surfaces of the first and second movable comb tooth portions 40A and 40B, the first and second fixed comb tooth portions 41A and 41B and the cantilever 42.

A vibration-driven energy harvesting assembly 11A is configured with the first movable comb tooth portion 40A and the first fixed comb tooth portion 41A and a vibration-driven energy harvesting assembly 11B is configured with the second movable comb tooth portion 40B and the second fixed comb tooth portion 41B. As in the first embodiment, electrets are disposed at electrode surfaces. As an external vibration is applied to the vibration-driven energy harvester 10, the cantilever 42 becomes flexed along the z direction, causing the first and second movable comb tooth portions 40A and 40B to vibrate along the z direction relative to the first and second fixed comb tooth portions 41A and 41B. Since the number of comb tooth electrodes disposed in the vibration-driven energy harvesting assembly 11B is smaller than the number of comb tooth electrodes disposed in the vibration-driven energy harvesting assembly 11A, the output from the vibration-driven energy harvesting assembly 11B is smaller than the output from the vibration-driven energy harvesting assembly 11A.

It is to be noted that while the amplitudes of the outputs are differentiated by disposing the fixed comb tooth electrodes and movable comb tooth electrodes in the vibration-driven energy harvesting assembly 11A in a total quantity different from the total quantity of the fixed comb tooth electrodes and movable comb tooth electrodes disposed in the vibration-driven energy harvesting assembly 11B in the structure illustrated in FIG. 10, the structure in which out-of-plane vibration is induced allows the output amplitudes to be differentiated instead by setting different lengths for the fixed comb tooth electrodes and the movable comb tooth electrodes in the vibration-driven energy harvesting assemblies 11A and 11B. It will be also obvious that different output amplitudes will be achieved by setting the distance between the fixed comb tooth electrodes and the movable comb tooth electrodes that are interdigitated with each other in the vibration-driven energy harvesting assembly 11A different from distance between the fixed comb tooth electrodes and the movable comb tooth electrodes that are interdigitated with each other in the vibration-driven energy harvesting assembly 11B, as in Variation 1 (see FIG. 6).

The levels of the outputs from the vibration-driven energy harvesting assemblies 11A and 11B are each dependent upon the electrode distance between the fixed comb tooth electrodes and the movable comb tooth electrodes, the area over which the fixed comb tooth electrodes and the movable comb tooth electrodes face opposite each other and the amounts of electric charges in the electrets formed at the fixed comb tooth electrodes or the movable comb tooth electrodes. In the embodiment and the variations thereof described above, the areas over which the fixed comb tooth electrodes and the movable comb tooth electrodes face opposite each other in the vibration-driven energy harvesting assemblies 11A and 11B are differentiated by setting different lengths or heights for the fixed comb tooth electrodes, and the distances between the comb tooth electrodes in the vibration-driven energy harvesting assemblies 11A and 11B are differentiated from each other by setting different widths for the fixed comb tooth electrodes. As an alternative, the output from the vibration-driven energy harvesting assembly 11A and the output from the vibration-driven energy harvesting assembly 11B can be differentiated from each other by differentiating an electret charge per unit area in the vibration-driven energy harvesting assembly 11A from an electret charge per unit area in the vibration-driven energy harvesting assembly 11B.

Variation 6

In the embodiment and the variations thereof described above, a plurality of fixed comb tooth electrodes are divided into two electrically insulated fixed comb tooth portions. As an alternative, a plurality of movable comb tooth electrodes disposed in a single movable portion 14 may be divided into two electrically insulated movable comb tooth portions, or a plurality of movable comb tooth electrodes disposed at a single movable portion 14 may be formed so that they are electrically insulated from one another.

Figure 11:
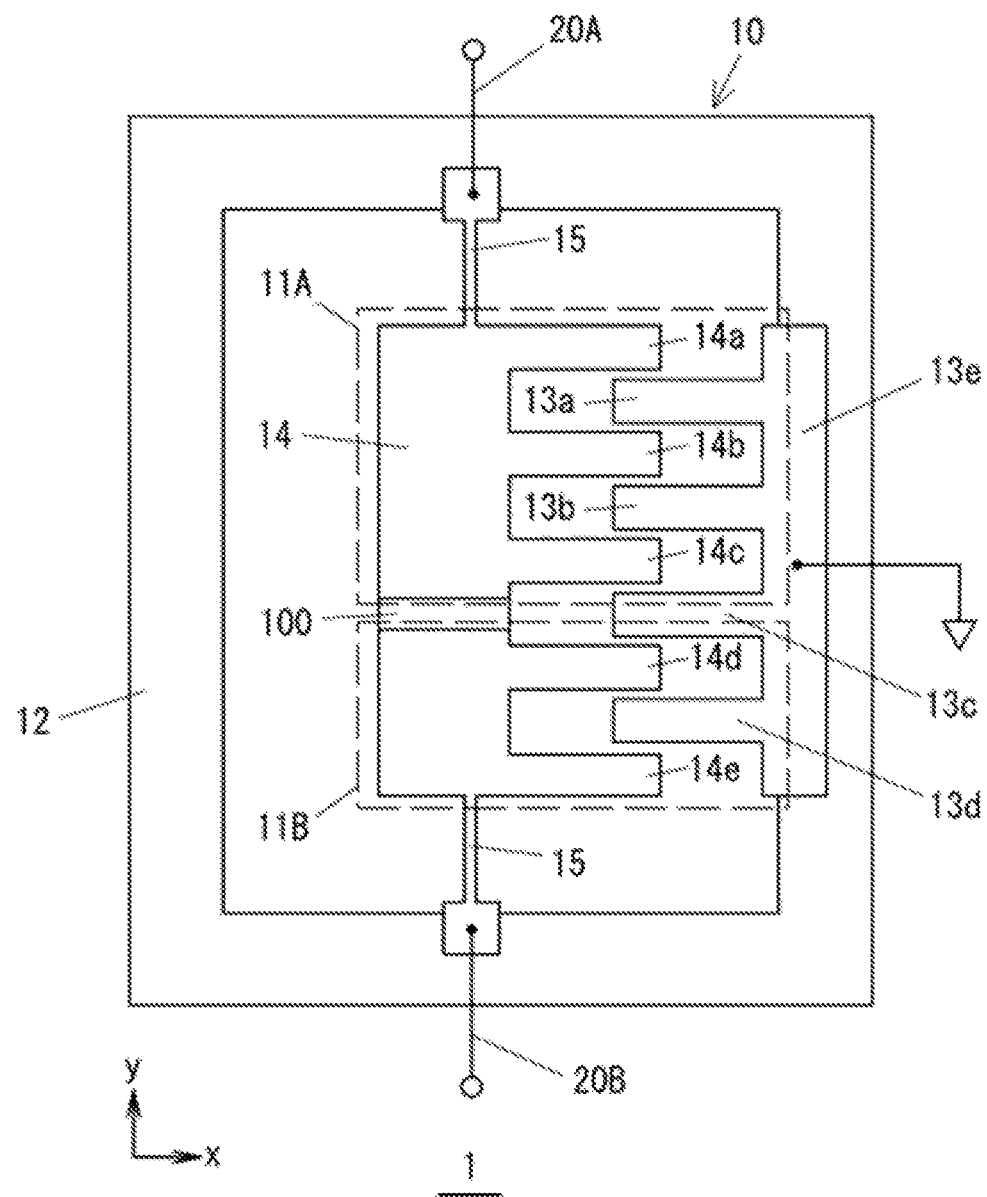
FIG. 11 illustrates a vibration-driven energy harvesting device achieved in Variation 6.

In the example presented in FIG. 11, movable comb tooth electrodes 14a through 14c, among movable comb tooth electrodes 14a through 14e formed at the movable portion 14, constitute a movable comb tooth portion belonging to the vibration-driven energy harvesting assembly 11A and the movable comb tooth electrodes 14d and 14e constitute a movable comb tooth portion belonging to the vibration-driven energy harvesting assembly 11B. At the movable portion 14, an upper Si layer 120 that forms the movable comb tooth electrodes 14a through 14c is separated from an upper Si layer 120 that forms the movable comb tooth electrodes 14d and 14e, and the movable comb tooth electrodes 14a through 14c are electrically insulated from the movable comb tooth electrodes 14d and 14e. A power output electrode 20A is connected to the movable comb tooth electrodes 14a through 14c and a monitor electrode 20B is connected the movable comb tooth electrodes 14d and 14e.

Figure 12:
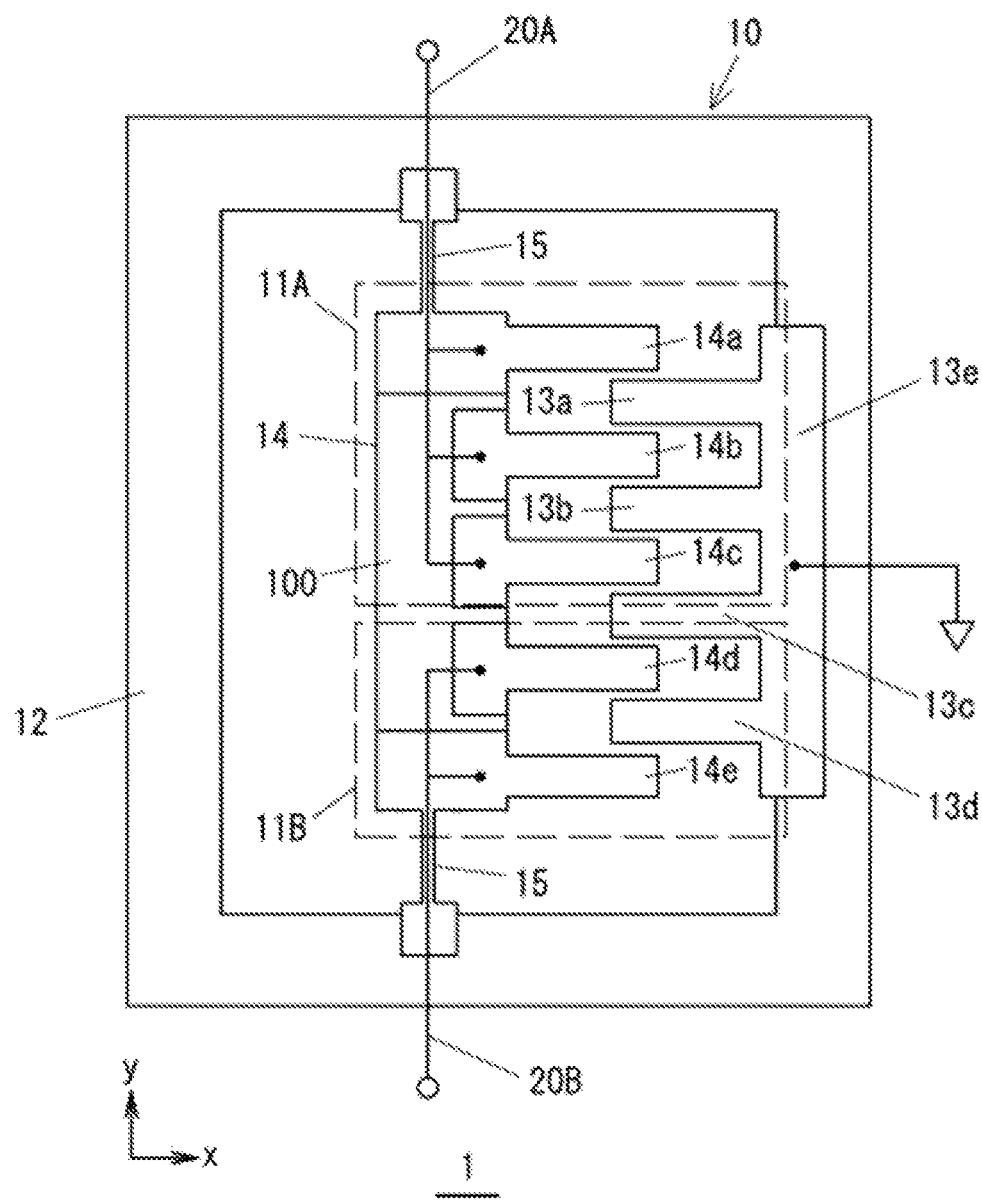
FIG. 12 illustrates a structure in which a plurality of movable comb tooth electrodes disposed at a movable portion are electrically separated.

FIG. 12 presents an example in which a plurality of movable comb tooth electrodes 14a through 14e disposed at a single movable portion 14 are formed so that they are electrically insulated from one another. The movable comb tooth electrodes 14a through 14e are formed upon a lower Si layer 100 via an SiO$_2$ layer 110, and the movable comb tooth electrodes 14a through 14e are formed with upper Si layers 120 separated from one another and electrically insulated from one another. A power output electrode 20A is connected to the movable tooth electrodes 14a through 14c and a monitor electrode 20B is connected to the movable comb tooth electrodes 14d and 14e. The power output electrode 20A and the monitor electrode 20B may be connected within the vibration-driven energy harvester 10 or their connections may be achieved outside the vibration-driven energy harvester 10. The structure shown in FIG. 12, too, allows the number of movable comb tooth electrodes, to which the monitor electrode 20B is connected, to be adjusted in correspondence to the output level required of the monitor signal or the purpose of use for the monitor signal, as does the structure shown in FIG. 1.

The vibration-driven energy harvesting device 1 and the vibration-driven energy harvester 10 having been described in reference to the embodiment and the variations thereof above may be summarized as follows.

(1) As FIG. 1 and FIG. 2 illustrate, the vibration-driven energy harvesting device 1 includes a vibration-driven energy harvester 10 having fixed comb tooth electrodes 13a through 13c and movable tooth electrodes 14a through 14d, together constituting a vibration-driven energy harvesting assembly 11A, and a fixed comb tooth electrode 13d and movable comb tooth electrodes 14d and 14e, together constituting a vibration-driven energy harvesting assembly 11B. The number of fixed comb tooth electrodes 13a through 13c to which a power output electrode 20A is connected is set different from the number of fixed comb tooth electrodes 13d to which a monitor electrode 20B is connected, i.e., the total number of fixed comb tooth electrodes and movable comb tooth electrodes disposed in the vibration-driven energy harvesting assembly 11A is differentiated from the total number of fixed comb tooth electrodes and movable comb tooth electrodes disposed in the vibration-driven energy harvesting assembly 11A, so as to achieve different outputs for the vibration-driven energy harvesting assembly 11A and the vibration-driven energy harvesting assembly 11B. The expression "different outputs" in this context means that the amplitude of a monitor signal output from the vibration-driven energy harvesting assembly 11B is different from the amplitude of an output signal from the vibration-driven energy harvesting assembly 11A.

The structure that allows a monitor signal, synchronous with the amplitude of the vibration of the movable portion 14, to be output independently from the power output as described above, makes it possible to accurately ascertain the vibrating condition of the vibration-driven energy harvester 10 based upon the monitor signal. For instance, the use of such a monitor signal makes it possible to utilize the generated power with high efficiency, as has been explained in reference to FIG. 5.

It is to be noted that while an explanation has been given on an example in which a monitor signal is utilized for the purpose of making use of generated power efficiently, the monitor signal may instead be used as a trigger signal for failure detection or as an input signal provided to a protection circuit in the event of an error.

(2) If the individual fixed comb tooth electrodes 13a through 13d disposed in the vibration-driven energy harvesting assemblies 11A and 11B are electrically insulated from one another in the vibration-driven energy harvester 10 as illustrated in FIG. 1, the power output electrode 20A is connected to the fixed comb tooth electrodes 13a through 13c in the vibration-driven energy harvesting assembly 11A and the monitor electrode 20B is connected to the fixed comb tooth electrode 13d in the vibration-driven energy harvesting assembly 11B. In addition, if the individual movable comb tooth electrodes 14a through 14e disposed in the vibration-driven energy harvesting assemblies 11A and 11B are electrically insulated from one another as illustrated in FIG. 12, the power output electrode 20A is connected to the movable comb tooth electrodes 14a through 14d in the vibration-driven energy harvesting assembly 11A and the monitor electrode 20B is connected the movable comb tooth electrodes 14d and 14e in the vibration-driven energy harvesting assembly 11B.

In comparison to the structure illustrated in FIG. 2, in which the vibration-driven energy harvester 10 is configured with comb tooth electrodes separated into a group of comb tooth electrodes to be connected to the power output electrode 20A and a group of comb tooth electrode(s) to be connected to the monitor electrode 20B, a structure such as that shown in FIG. 1 with all the fixed comb tooth electrodes formed so that they are electrically insulated from one another better facilitates adjustment of the number of comb tooth electrodes, to which the monitor electrode 20B is connected, in correspondence to the level of output required of the monitor signal or in correspondence to the purpose of use of the monitor signal.

It is to be noted that in the example presented in FIG. 1 or FIG. 12, the individual fixed comb tooth electrodes 13a through 13d or the individual movable comb tooth electrodes 14a through 14e are electrically insulated from one another. In the example presented in FIG. 2, the fixed comb tooth electrodes 13a through 13c in the vibration-driven energy harvesting assembly 11A are formed as an electrically integrated unit, whereas in the example presented in FIG. 11, the movable comb tooth electrodes 14a through 14c in the vibration-driven energy harvesting assembly 11A and the movable comb tooth electrodes 14d and 14e in the vibration-driven energy harvesting assembly 11B are formed as electrically integrated units. However, the present invention is not limited to these structural examples, and it may adopt alternative structures such as those illustrated in FIG. 13($a$) and FIG. 13($b$).

Figure 13:
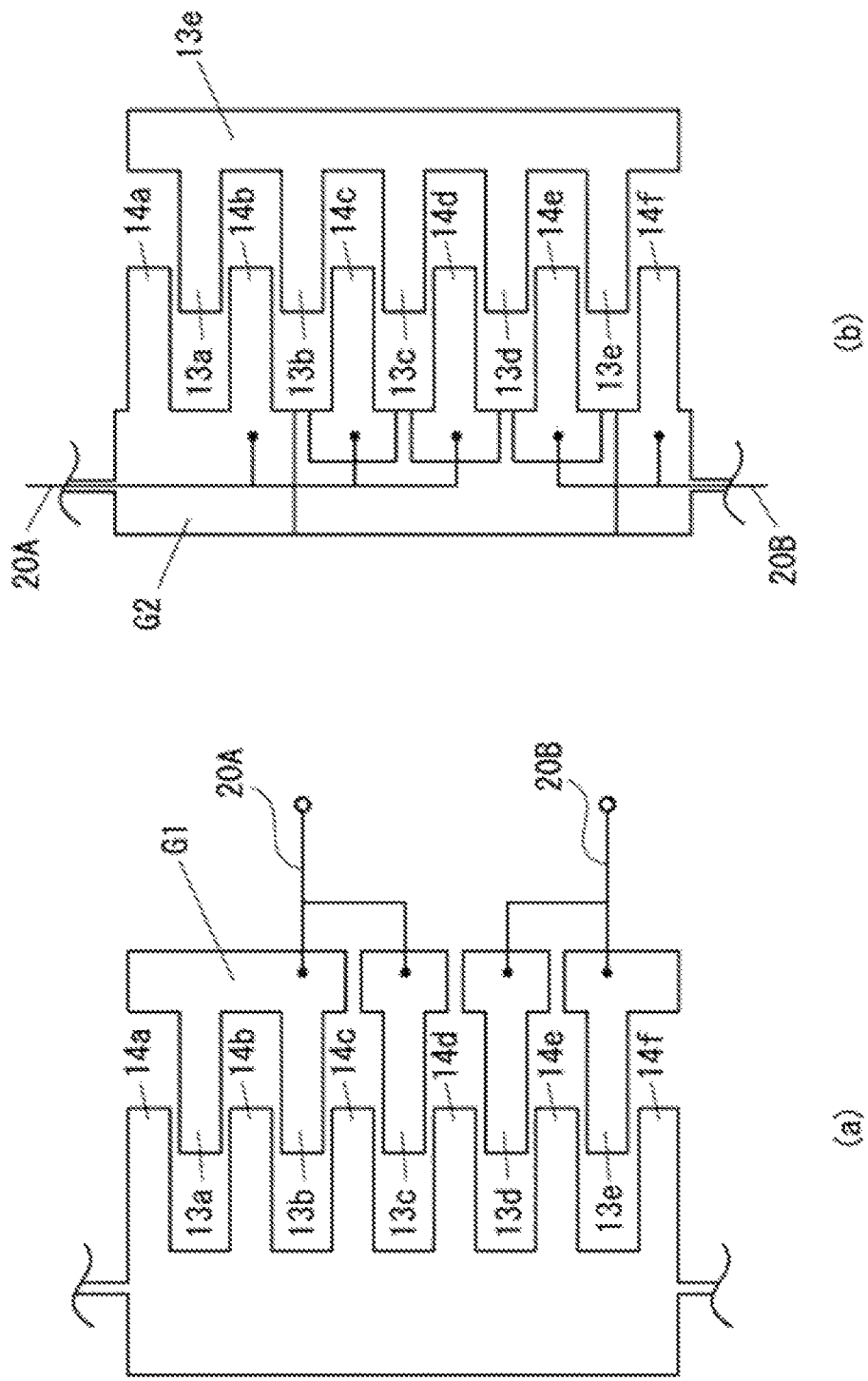
FIG. 13 illustrates a fixed comb tooth group and a movable comb tooth group.

In the example presented in FIG. 13($a$), a power output electrode 20A is connected to fixed comb tooth electrodes 13a through 13c, i.e., a fixed comb tooth electrode 13c and a fixed comb tooth group G1 made up with fixed comb tooth electrodes 13a and 13b formed as an electrically integrated unit. It is to be noted that the fixed comb tooth electrode 13c, too, may be considered to be a fixed comb tooth group constituted with a single fixed comb tooth electrode. Fixed comb tooth electrodes 13d and 13e to which a monitor electrode 20B is connected are electrically insulated from each other, and the fixed comb tooth electrode 13d and the fixed comb tooth electrode 13e, too, may each be regarded to constitute a fixed comb tooth group.

In the example presented in FIG. 13($b$), among movable comb tooth electrodes 14a through 14d to which a power output electrode 20A is connected, the movable comb tooth electrodes 14a and 14b (fixed comb tooth group G2) are formed as an electrically integrated unit, whereas the movable comb tooth electrodes 14c and 14d are each electrically insulated. The movable comb tooth electrodes 14c and 14d each constitute a movable comb tooth group made up with a single movable comb tooth electrode. Movable comb tooth electrodes 14e and 14f, to which a monitor electrode 20B is connected, are electrically insulated from each other. The movable comb tooth electrodes 14e and 14f, too, each constitute a movable comb tooth group made up with a single movable comb tooth electrode.

As described above, at least either of a first fixed comb tooth portion (the fixed comb tooth electrodes 13a through 13c) and a second fixed comb tooth portion (the fixed comb tooth electrodes 13d and 13e), which are electrically insulated from each other, includes at least two fixed comb tooth groups electrically insulated from each other in the example presented in FIG. 13(a). In addition, at least either of a first movable comb tooth portion (the movable comb tooth electrodes 14a through 14d) and a second movable comb tooth portion (the movable comb tooth electrodes 14e and 14f), which are electrically insulated from each other, includes at least two movable comb tooth groups electrically insulated from each other in the example presented in FIG. 13(b).

(3) The output of the vibration-driven energy harvesting assembly 11A and the output of the vibration-driven energy harvesting assembly 11B may be differentiated from each other by disposing fixed comb tooth electrodes and movable comb tooth electrodes in the vibration-driven energy harvesting assembly 11A in a total quantity different from the total quantity of fixed comb tooth electrodes and movable comb tooth electrodes disposed in the vibration-driven energy harvesting assembly 11B as illustrated in FIGS. 1, 2 and 9 through 13, by setting different comb tooth heights for at least either of the fixed comb tooth electrodes and the movable comb tooth electrodes that are interdigitated in the vibration-driven energy harvesting assembly 11A and in the vibration-driven energy harvesting assembly 11B as has been explained in reference to Variation 2 (see FIG. 7), or by setting different distances between the fixed comb tooth electrodes and the movable comb tooth electrodes that are interdigitated in the vibration-driven energy harvesting assembly 11A and in the vibration-driven energy harvesting assembly 11B, as has been explained in reference to Variation 1 (see FIG. 6).

(4) In addition, in the vibration-driven energy harvester 10 adopting a structure such as that illustrated in FIG. 8, in which movable comb tooth electrodes are induced to engage in in-plane vibration relative to fixed comb tooth electrodes, the comb tooth length of the fixed comb tooth electrodes 13d and 13d in the vibration-driven energy harvesting assembly 11B may be set smaller than the comb tooth length of the fixed comb tooth electrodes 13a and 13b in the vibration-driven energy harvesting assembly 11A, or the comb tooth length of the movable comb tooth electrodes 14d and 14e in the vibration-driven energy harvesting assembly 11B may be set smaller than the comb tooth length of the movable tooth electrodes 14a and 14b in the vibration-driven energy harvesting assembly 11A such that the fixed comb tooth electrodes 13d and 13d and the movable comb tooth electrodes 14d and 14e may be set to be in a non-interdigitated state when there is no vibration.

The structure described above allows a monitor signal to be output only over a range near the maximum output peak at which the fixed comb tooth electrodes 13c and 13d and the movable comb tooth electrodes 14c through 14e enter an interdigitated state in the vibration-driven energy harvesting assembly 11B. This means that the timing with which the output from the power output electrode 20A peaks can be detected based upon the monitor signal.

(5) Furthermore, the amplitudes of the outputs of the vibration-driven energy harvesting assembly 11A and the vibration-driven energy harvesting assembly 11B can be differentiated from each other by ensuring that the amount of electret charge per unit area at the vibration-driven energy harvesting assembly 11A is different from the amount of electret charge per unit area at the vibration-driven energy harvesting assembly 11B, as has been explained in reference to Variation 5. In this case, a waveform with an amplitude proportional to the amplitude of the vibration of the movable unit 14 is achieved with respect to the output from the vibration-driven energy harvesting assembly 11B, which makes it possible to utilize the output of the vibration-driven energy harvesting assembly 11B as a monitor signal.

It is to be noted that while comb tooth electrodes are formed by using the upper Si layer 120 of the SOI substrate and electrical insulation is achieved by physically separating the fixed comb tooth electrodes in the embodiment described in reference to FIGS. 1 and 2, electrical insulation may be achieved through a method other than this. For instance, comb teeth may be formed with quartz, a silicon layer may be formed at the comb teeth and comb tooth electrodes may then be formed by rendering the silicon layer into electrets. In such a case, the silicon layer may be formed in correspondence to each comb tooth as shown in FIG. 1, so as to form comb tooth electrodes that are electrically insulated from one another, or silicon layers may be formed in correspondence to two separate groups, as illustrated in FIG. 2, so as to form two groups of comb tooth electrodes electrically insulated from each other.

While an explanation has been given on an embodiment and variations thereof, the present invention is in no way limited to the particulars of these examples. Other modes conceivable within the scope of the technical teachings of the present invention are also within the scope of the present invention.

The disclosure of the following priority application is herein incorporated by reference: Japanese Patent Application No. 2018-105434, filed May 31, 2018

REFERENCE SIGNS LIST 1, 30 . . . vibration-driven energy harvesting device, 10 . . . vibration-driven energy harvester, 11A, 11B . . . vibration-driven energy harvesting assembly, 12 . . . base, 13a~13d . . . fixed comb tooth electrode, 14 . . . movable portion, 14a~14e . . . movable comb tooth electrode, 15 . . . elastic support portion, 20A . . . power output electrode, 20B . . . monitor electrode, 21 . . . power conversion unit, 22 . . . amplitude detection circuit, 23 . . . charge unit, 31 . . . movable comb tooth portion, 32 . . . fixed comb tooth portion, 40A . . . first movable comb tooth portion, 40B . . . second movable comb tooth portion, 41A . . . first fixed comb tooth portion, 41B . . . second fixed comb tooth portion, 42 . . . cantilever, G1 . . . fixed comb tooth group, G2 . . . movable comb tooth group

The invention claimed is:

1. A vibration-driven energy harvesting device, comprising:
   a first vibration-driven energy harvesting assembly constituted with a first fixed comb tooth portion and a first movable comb tooth portion that are interdigitated with each other;
   a second vibration-driven energy harvesting assembly constituted with a second fixed comb tooth portion and a second movable comb tooth portion that are interdigitated with each other;

a first output electrode connected to the first vibration-driven energy harvesting assembly; and
a second output electrode connected to the second vibration-driven energy harvesting assembly,
wherein
the first fixed comb tooth portion and the second fixed comb tooth portion are arranged laterally adjacent to one another in a direction perpendicular to a direction of movement of the first and second movable comb tooth portions, and
during operation of the vibration-driven energy harvesting device an electrical output of the first vibration-driven energy harvesting assembly is different from an electrical output of the second vibration-driven energy harvesting assembly.

2. The vibration-driven energy harvester used in the vibration-driven energy harvesting device according to claim 1, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
comb teeth included in the first fixed comb tooth portion and the second fixed comb tooth portion are each electrically insulated, with the first output electrode connected to the first fixed comb tooth portion and the second output electrode connected to the second fixed comb tooth portion, or comb teeth included in the first movable comb tooth portion and the second movable comb tooth portion are each electrically insulated, with the first output electrode connected to the first movable comb tooth portion and the second output electrode connected to the second movable comb tooth portion.

3. The vibration-driven energy harvester according to claim 2, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a total quantity of comb teeth included in the first fixed comb tooth portion and the first movable comb tooth portion is different from a total quantity of comb teeth included in the second fixed comb tooth portion and the second movable comb tooth portion.

4. The vibration-driven energy harvester according to claim 2, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a comb tooth height of at least either of the first fixed comb tooth portion and the first movable comb tooth portion, which are interdigitated with each other, is different from a comb tooth height of the second fixed comb tooth portion and the second movable comb tooth portion, which are interdigitated with each other.

5. The vibration-driven energy harvester according to claim 2, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a distance between comb teeth in the first fixed comb tooth portion and the first movable comb tooth portion, which are interdigitated with each other, is different from a distance between comb teeth in the second fixed comb tooth portion and the second movable comb tooth portion, which are interdigitated with each other.

6. The vibration-driven energy harvester according to claim 2, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a comb tooth length of the second fixed comb tooth portion or the second movable comb tooth portion is set smaller than a comb tooth length of the first fixed comb tooth portion and the first movable comb tooth portion, and the second fixed comb tooth portion and the second movable comb tooth portion are set to be a non-interdigitated state when no vibration is occurring.

7. The vibration-driven energy harvester according to claim 2, wherein:
electrets are formed at at least either of comb teeth in the first vibration-driven energy harvesting assembly and comb teeth in the second vibration-driven energy harvesting assembly that are interdigitated with each other.

8. The vibration-driven energy harvester used in the vibration-driven energy harvesting device according to claim 1, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
the first fixed comb tooth portion and the second fixed comb tooth portion are electrically insulated, with the first output electrode connected to the first fixed comb tooth portion and the second output electrode connected to the second fixed comb tooth portion, or the first movable comb tooth portion and the second movable comb tooth portion are electrically insulated, with the first output electrode connected to the first movable comb tooth portion and the second output electrode connected to the second movable comb tooth portion.

9. The vibration-driven energy harvester according to claim 8, wherein:
at least either of the first fixed comb tooth portion and the second fixed comb portion, which are electrically insulated from each other, includes at least two electrically insulated fixed comb tooth groups, or at least either of the first movable comb tooth portion and the second movable comb tooth portion, which are electrically insulated from each other, includes at least two electrically insulated movable comb tooth groups.

10. The vibration-driven energy harvester according to claim 9, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:

a total quantity of comb teeth included in the first fixed comb tooth portion and the first movable comb tooth portion is different from a total quantity of comb teeth included in the second fixed comb tooth portion and the second movable comb tooth portion.

11. The vibration-driven energy harvester according to claim 9, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a comb tooth height of at least either of the first fixed comb tooth portion and the first movable comb tooth portion, which are interdigitated with each other, is different from a comb tooth height of the second fixed comb tooth portion and the second movable comb tooth portion, which are interdigitated with each other.

12. The vibration-driven energy harvester according to claim 9, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a distance between comb teeth in the first fixed comb tooth portion and the first movable comb tooth portion, which are interdigitated with each other, is different from a distance between comb teeth in the second fixed comb tooth portion and the second movable comb tooth portion, which are interdigitated with each other.

13. The vibration-driven energy harvester according to claim 9, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a comb tooth length of the second fixed comb tooth portion or the second movable comb tooth portion is set smaller than a comb tooth length of the first fixed comb tooth portion and the first movable comb tooth portion, and the second fixed comb tooth portion and the second movable comb tooth portion are set to be a non-interdigitated state when no vibration is occurring.

14. The vibration-driven energy harvester according to claim 9, wherein:
electrets are formed at at least either of comb teeth in the first vibration-driven energy harvesting assembly and comb teeth in the second vibration-driven energy harvesting assembly that are interdigitated with each other.

15. The vibration-driven energy harvester according to claim 8, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a total quantity of comb teeth included in the first fixed comb tooth portion and the first movable comb tooth portion is different from a total quantity of comb teeth included in the second fixed comb tooth portion and the second movable comb tooth portion.

16. The vibration-driven energy harvester according to claim 8, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a comb tooth height of at least either of the first fixed comb tooth portion and the first movable comb tooth portion, which are interdigitated with each other, is different from a comb tooth height of the second fixed comb tooth portion and the second movable comb tooth portion, which are interdigitated with each other.

17. The vibration-driven energy harvester according to claim 8, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a distance between comb teeth in the first fixed comb tooth portion and the first movable comb tooth portion, which are interdigitated with each other, is different from a distance between comb teeth in the second fixed comb tooth portion and the second movable comb tooth portion, which are interdigitated with each other.

18. The vibration-driven energy harvester according to claim 8, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
a comb tooth length of the second fixed comb tooth portion or the second movable comb tooth portion is set smaller than a comb tooth length of the first fixed comb tooth portion and the first movable comb tooth portion, and the second fixed comb tooth portion and the second movable comb tooth portion are set to be a non-interdigitated state when no vibration is occurring.

19. The vibration-driven energy harvester according to claim 8, wherein:
electrets are formed at at least either of comb teeth in the first vibration-driven energy harvesting assembly and comb teeth in the second vibration-driven energy harvesting assembly that are interdigitated with each other.

20. The vibration-driven energy harvester used in the vibration-driven energy harvesting device according to claim 1, comprising:
the first vibration-driven energy harvesting assembly constituted with the first fixed comb tooth portion and the first movable comb tooth portion; and
the second vibration-driven energy harvesting assembly constituted with the second fixed comb tooth portion and the second movable comb tooth portion, wherein:
electrets are formed at at least either of comb teeth in the first vibration-driven energy harvesting assembly and comb teeth in the second vibration-driven energy harvesting assembly that are interdigitated with each other; and
an amount of electret charge per unit area in the first vibration-driven energy harvesting assembly is different from an amount of electret charge per unit area in the second vibration-driven energy harvesting assembly.

* * * * *